US008300687B1

(12) United States Patent
Eliezer

(10) Patent No.: US 8,300,687 B1

(45) Date of Patent: Oct. 30, 2012

(54) TIMING AND TIME INFORMATION EXTRACTION IN A RADIO CONTROLLED CLOCK RECEIVER

(75) Inventor: Oren E. Eliezer, Plano, TX (US)

(73) Assignee: XW LLC, Dallas, TX (US)

( * ) Notice: Subject to any disclaimer, the term of this patent is extended or adjusted under 35 U.S.C. 154(b) by 0 days.

(21) Appl. No.: 13/424,733

(22) Filed: Mar. 20, 2012

Related U.S. Application Data

(60) Provisional application No. 61/559,966, filed on Nov. 15, 2011.

(51) Int. Cl.
*H03K 7/08* (2006.01)

(52) U.S. Cl. .......................................................... 375/238

(58) Field of Classification Search ................... 375/238
See application file for complete search history.

(56) References Cited

U.S. PATENT DOCUMENTS

| | | | | |
|---|---|---|---|---|
| 4,117,661 | A | 10/1978 | Bryant, Jr. | |
| 4,500,985 | A * | 2/1985 | Chang | 370/244 |
| 4,525,685 | A | 6/1985 | Hesselberth et al. | |
| 4,768,178 | A | 8/1988 | Conklin et al. | |
| 5,805,647 | A * | 9/1998 | Schafer et al. | 375/366 |
| 7,027,773 | B1 | 4/2006 | McMillin | |
| 7,324,615 | B2 | 1/2008 | Lourens et al. | |
| 7,411,870 | B2 | 8/2008 | Murata et al. | |
| 7,636,397 | B2 | 12/2009 | McLaughlin | |
| 7,720,452 | B2 | 5/2010 | Miyahara et al. | |
| 7,738,322 | B2 | 6/2010 | Murata et al. | |
| 2003/0169641 | A1 | 9/2003 | O'Neill et al. | |
| 2004/0196926 | A1 | 10/2004 | Chien et al. | |
| 2004/0239415 | A1 | 12/2004 | Bishop | |
| 2005/0105399 | A1* | 5/2005 | Strumpf et al. | 368/47 |
| 2005/0111530 | A1 | 5/2005 | Chen et al. | |
| 2005/0141648 | A1 | 6/2005 | Lourens et al. | |
| 2005/0175039 | A1 | 8/2005 | Haefner et al. | |
| 2005/0213433 | A1 | 9/2005 | Mah | |
| 2006/0140282 | A1* | 6/2006 | Kondo | 375/242 |
| 2007/0115759 | A1* | 5/2007 | Sano | 368/47 |
| 2007/0140064 | A1 | 6/2007 | Fujisawa | |
| 2007/0164903 | A1 | 7/2007 | Takada | |
| 2008/0049558 | A1 | 2/2008 | Shimizu | |

(Continued)

OTHER PUBLICATIONS

Hetzel, P., Time Dissemination via the LF Transmitter DCF77 using a Pseudo-Random Phase-Shift Keying of the Carrier, 2nd EP Freq & Time Forum, Session TF-05, No. 3, Mar. 16, 1988.*

(Continued)

*Primary Examiner* — David C. Payne
*Assistant Examiner* — Brian J Stevens
(74) *Attorney, Agent, or Firm* — Woods Oviatt Gilman LLP; Howard Zaretsky

(57) ABSTRACT

A novel and useful system and method for extracting timing, time and additional information from a broadcast received in a radio controlled clock (RCC) receiver. The RCC receiver extracts timing information represented by a known synchronization sequence that is used for acquisition and tracking purposes. The RCC receiver extracts time information as a merged 26-bit time information word linearly coded into 31 bits comprising the number of minutes (or hours) since the turn of the current century. A minute counter representing the 26 bits is converted into the date, hour, and minute. The RCC extracts additional information including the schedule for the next daylight saving time transition and for an imminent leap second. The communications protocol optionally employs error correcting codes to provide protection for data fields in the frame, which the RCC may use to enhance reception reliability in the presence of noise and interference.

28 Claims, 10 Drawing Sheets

U.S. PATENT DOCUMENTS

| | | | | |
|---|---|---|---|---|
| 2009/0016171 | A1 | 1/2009 | Fujisawa | |
| 2009/0054075 | A1 | 2/2009 | Boejer et al. | |
| 2009/0122927 | A1 | 5/2009 | Walton et al. | |
| 2009/0274011 | A1 | 11/2009 | Fujisawa | |
| 2012/0082008 | A1* | 4/2012 | Eliezer et al. | 368/47 |

OTHER PUBLICATIONS

Lowe, John, We Help Move Time Through the Air, RadioWorld, vol. 35, No. 8, Mar. 23, 2011.*

* cited by examiner

CLOCK INFORMATION FRAME

| | | | | | | | | | | |
|---|---|---|---|---|---|---|---|---|---|---|
| SECOND | 0 | 1 | 2 | 3 | 4 | 5 | 6 | 7 | 8 | 9 |
| AMPLITUDE | MARKER | MIN[6] | MIN[5] | MIN[4] | 0 | MIN[3] | MIN[2] | MIN[1] | MIN[0] | MARKER |
| PHASE | SYNC[12] | SYNC[11] | SYNC[10] | SYNC[9] | SYNC[8] | SYNC[7] | SYNC[6] | SYNC[5] | SYNC[4] | SYNC[3] |
| SECOND | 10 | 11 | 12 | 13 | 14 | 15 | 16 | 17 | 18 | 19 |
| AMPLITUDE | 0 | 0 | HOUR[5] | HOUR[4] | 0 | HOUR[3] | HOUR[2] | HOUR[1] | HOUR[0] | MARKER |
| PHASE | SYNC[2] | SYNC[1] | SYNC[0] | TIMEPAR[4] | TIMEPAR[3] | TIMEPAR[2] | TIMEPAR[1] | TIMEPAR[0] | HOUR[19] | R |
| SECOND | 20 | 21 | 22 | 23 | 24 | 25 | 26 | 27 | 28 | 29 |
| AMPLITUDE | 0 | 0 | DAY[9] | DAY[8] | 0 | DAY[7] | DAY[6] | DAY[5] | DAY[4] | MARKER |
| PHASE | HOUR[18] | HOUR[17] | HOUR[16] | HOUR[15] | HOUR[14] | HOUR[13] | HOUR[12] | HOUR[11] | HOUR[10] | R |
| SECOND | 30 | 31 | 32 | 33 | 34 | 35 | 36 | 37 | 38 | 39 |
| AMPLITUDE | DAY[3] | DAY[2] | DAY[1] | DAY[0] | 0 | 0 | DUTS[2] | DUTS[1] | DUTS[0] | MARKER |
| PHASE | HOUR[9] | HOUR[8] | HOUR[7] | HOUR[6] | HOUR[5] | HOUR[4] | HOUR[3] | HOUR[2] | HOUR[1] | R |
| SECOND | 40 | 41 | 42 | 43 | 44 | 45 | 46 | 47 | 48 | 49 |
| AMPLITUDE | DUT[3] | DUT[2] | DUT[1] | DUT[0] | 0 | YEAR[7] | YEAR[6] | YEAR[5] | YEAR[4] | MARKER |
| PHASE | HOUR[0] | MIN[5] | MIN[4] | MIN[3] | MIN[2] | MIN[1] | MIN[0] | DSTON | LEAP | R |
| SECOND | 50 | 51 | 52 | 53 | 54 | 55 | 56 | 57 | 58 | 59 |
| AMPLITUDE | YEAR[3] | YEAR[2] | YEAR[1] | YEAR[0] | 0 | LYI | LSW | DST[1] | DST[0] | MARKER |
| PHASE | DLPAR[2] | DLPAR[1] | DLPAR[0] | DST[5] | DST[4] | DST[3] | DST[2] | DST[1] | DST[0] | SYNC[13] |

146 142 144 140

FIG. 9

TIME INFORMATION FRAME 172 174

| | | | | | | | | | | |
|---|---|---|---|---|---|---|---|---|---|---|
| SECOND | 0 | 1 | 2 | 3 | 4 | 5 | 6 | 7 | 8 | 9 |
| AMPLITUDE | MARKER | TIME[6] | TIME[5] | TIME[4] | 0 | TIME[3] | TIME[2] | TIME[1] | TIME[0] | MARKER |
| PHASE | SYNC[12] | SYNC[11] | SYNC[10] | SYNC[9] | SYNC[8] | SYNC[7] | SYNC[6] | SYNC[5] | SYNC[4] | SYNC[3] |
| SECOND | 10 | 11 | 12 | 13 | 14 | 15 | 16 | 17 | 18 | 19 |
| AMPLITUDE | 0 | 0 | TIME[5] | TIME[4] | 0 | TIME[3] | TIME[2] | TIME[1] | TIME[0] | MARKER |
| PHASE | SYNC[2] | SYNC[1] | SYNC[0] | TIMEPAR[4] | TIMEPAR[3] | TIMEPAR[2] | TIMEPAR[1] | TIMEPAR[0] | TIME[25] | TIME[0] |
| SECOND | 20 | 21 | 22 | 23 | 24 | 25 | 26 | 27 | 28 | 29 |
| AMPLITUDE | 0 | 0 | DAY[9] | DAY[8] | 0 | DAY[7] | DAY[6] | DAY[5] | DAY[4] | MARKER |
| PHASE | TIME[24] | TIME[23] | TIME[22] | TIME[21] | TIME[20] | TIME[19] | TIME[18] | TIME[17] | TIME[16] | TIME[0] |
| SECOND | 30 | 31 | 32 | 33 | 34 | 35 | 36 | 37 | 38 | 39 |
| AMPLITUDE | DAY[3] | DAY[2] | DAY[1] | DAY[0] | 0 | 0 | DUTS[2] | DUTS[1] | DUTS[0] | MARKER |
| PHASE | TIME[15] | TIME[14] | TIME[13] | TIME[12] | TIME[11] | TIME[10] | TIME[9] | TIME[8] | TIME[7] | TIME[0] |
| SECOND | 40 | 41 | 42 | 43 | 44 | 45 | 46 | 47 | 48 | 49 |
| AMPLITUDE | DUT[3] | DUT[2] | DUT[1] | DUT[0] | 0 | YEAR[7] | YEAR[6] | YEAR[5] | YEAR[4] | MARKER |
| PHASE | TIME[6] | TIME[5] | TIME[4] | TIME[3] | TIME[2] | TIME[1] | TIME[0] | DSTON | LEAP | TIME[0] |
| SECOND | 50 | 51 | 52 | 53 | 54 | 55 | 56 | 57 | 58 | 59 |
| AMPLITUDE | YEAR[3] | YEAR[2] | YEAR[1] | YEAR[0] | 0 | LYI | LSW | DST[1] | DST[0] | MARKER |
| PHASE | DLPAR[2] | DLPAR[1] | DLPAR[0] | DST[5] | DST[4] | DST[3] | DST[2] | DST[1] | DST[0] | SYNC[13] |

170

FIG.10

TIMING AND TIME INFORMATION EXTRACTION IN A RADIO CONTROLLED CLOCK RECEIVER

REFERENCE TO PRIORITY APPLICATION

This application claims priority to U.S. Provisional Application Ser. No. 61/559,966, filed Nov. 15, 2011, entitled "Reception of Time Information and Synchronization Information in a Radio Controlled Clock," incorporated herein by reference in its entirety.

STATEMENT OF GOVERNMENT INTEREST

This invention was made with Government support under National Institute of Standards and Technology under SBIR Grant No. NB401000-11-04154. The Government has certain rights in the invention.

FIELD OF THE INVENTION

The present invention relates to the field of wireless communications, and more particularly relates to a timing, time and additional information broadcast protocol for use in a radio controlled clock receiver.

BACKGROUND OF THE INVENTION

Radio-controlled-clock (RCC) devices that rely on time signal broadcasts have become widely used in recent years. A radio-controlled-clock (RCC) is a timekeeping device that provides the user with accurate timing information that is derived from a received signal, which is broadcast from a central location, to allow multiple users to be aligned or synchronized in time. Colloquially, these are often referred to as "atomic clocks" due to the nature of the source used to derive the timing at the broadcasting side. In the United States, the National Institute of Standards and Technology (NIST) provides such broadcast in the form of a low-frequency (60 kHz) digitally-modulated signal that is transmitted at high power from radio station WWVB in Fort Collins, Colo. The information encoded in this broadcast includes the official time of the United States.

Similar services operating at low frequencies exist in other regions worldwide, including Europe and Japan. Many consumer-market products exist, including watches, alarm clocks and wall clocks, that are capable of receiving one or more of these broadcasts and which can display the correct time to within approximately one or two seconds of accuracy. While the broadcast may be active continuously, a typical radio-controlled clock may be set to receive the broadcast only once a day. Such reception, if successful (depending on the condition of the wireless link and potential interference), is typically used to reset the timekeeping device, such that if it were set incorrectly or has drifted away from the correct time, it will be set in accordance to the time communicated through the broadcast signal.

Reception of the time signal, however, is being challenged by a growing number of sources of electromagnetic interference. In particular, the on-frequency interference from the MSF radio station in the United Kingdom has been identified as a particularly challenging jammer for receivers on the East Coast.

There is thus a need for an improved protocol for time signal broadcasts, such as that provided by WWVB in the United States and radio stations in other countries, that attempts to cost-effectively address the reception challenges.

Such a new protocol should preserve existing amplitude modulation properties of the transmitted signal, in order to maintain backwards compatibility and not impact existing devices.

SUMMARY OF THE INVENTION

A novel and useful method for extracting timing, time and additional information from a broadcast communications protocol for use in a radio controlled clock (RCC) receiver. Information is transmitted in 60 second frames. The RCC receiver extracts timing information represented by the phase of a known synchronization sequence that is used both for time-acquisition and for timing-tracking purposes in the RCC. The RCC receiver also extracts time information including hour, minute, date and year information that are represented in a merged time field comprising the number of minutes (or hours) since the turn of the current century. The RCC also extracts additional information from the received frame, including daylight-saving time (DST) schedule and leap second information. The communications protocol also optionally uses error correcting codes to provide protection for one or more data fields of the 60 second frame.

There is thus provided, in accordance with the invention, a radio controlled clock (RCC) method comprising (1) receiving a phase modulated (PM), pulse width modulated (PWM)/amplitude shift keyed (ASK) broadcast signal encoded with time information frames, (2) extracting the time and timing information frames from the phase of the received signal, and wherein each of the time information frame includes a synchronization sequence field and a current time field, and (3) responding to the extracted information by appropriately setting the time and date information in the time-keeping device and by adjusting its timing.

There is also provided, in accordance with the invention, a radio receiver method comprising (1) receiving a phase modulated (PM), pulse width modulated (PWM)/amplitude shift keyed (ASK) broadcast signal encoded with time information frames, (2) extracting the time information frames from the phase of the received signal, wherein each the time information frame includes a synchronization sequence field, a current time field, daylight savings time data field and leap second data field, and wherein the current time field, and the field designated to daylight saving time and leap second scheduling are protected using an error correcting code, (3) optionally employing error detection and correction in the received fields in order to enhance the reception reliability, and (4) providing a time-keeping device with the extracted information.

There is further provided, in accordance with the invention, a radio receiver method comprising (1) receiving a phase modulated (PM) broadcast signal encoded with time information frames, (2) extracting the time information frames from the phase of the received signal, wherein each the time information frame includes a synchronization sequence field and a current time field, and (3) providing a time-keeping device with the extracted information for use in a time-based control system, such as an irrigation or heating system, or in a wrist-watch, wall-clock or night-table alarm-clock, or in any other device where there is need for either the absolute official time or for timing synchronization amongst multiple devices, or for both.

There is also provided, in accordance with the invention, a radio receiver, comprising a receiver circuit operative to receive a phase modulated (PM), pulse width modulation (PWM)/amplitude shift keyed (ASK)-broadcast signal encoded with time information frames, a circuit operative to extract the time information frames from the phase of the received signal, wherein each time information frame includes a synchronization sequence field and a current time field.

BRIEF DESCRIPTION OF THE DRAWINGS

The invention is herein described, by way of example only, with reference to the accompanying drawings, wherein:

FIG. 9 is a diagram illustrating a fourth example time information frame structure incorporating timing, time and additional information;

FIG. 10 is a diagram illustrating a fifth example time information frame structure incorporating timing, time and additional information;

DETAILED DESCRIPTION OF THE INVENTION

Figure 1:
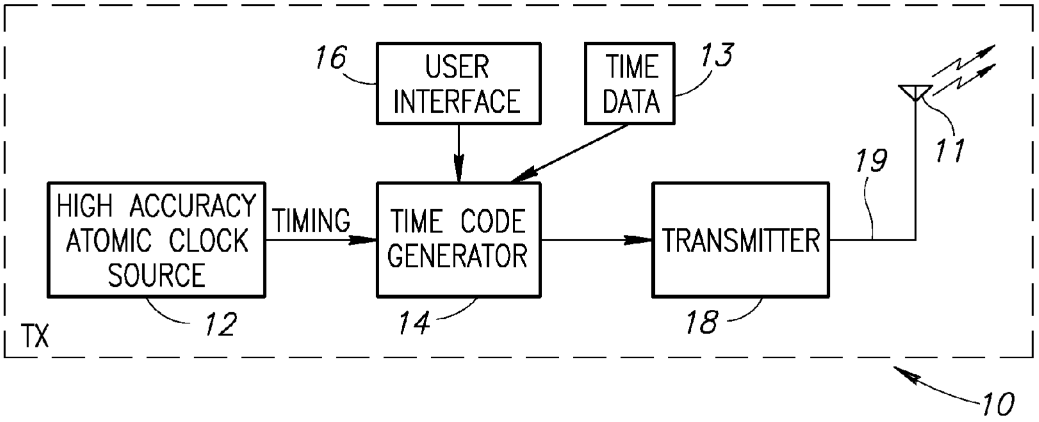
FIG. 1 is a high level block diagram illustrating an example timing and time information transmitter of a system operating in accordance with the present invention.

The system and method of the present invention is a receiver that receives, demodulates and decodes a broadcast signal, whose modulation and encoding of time and timing information, representing the novel communications protocol of the present invention, allow for reliable and power-efficient operation. The communication protocol of the present invention is adapted to allow for prior art devices, operating in accordance with an historical communication protocol, to be unaffected by the changes introduced by the protocol of the present invention. Devices that are adapted to operate in accordance with the present invention will benefit, however, from various performance advantages. These advantages include greater robustness of the communication link, allowing reliable operation at a much lower signal-to-noise-and-interference-ratio (SNIR), greater reliability in providing the correct time, and reduced energy consumption, resulting in extended battery life in battery-operated devices.

In accordance with one embodiment of the present invention, only phase modulation is applied to the carrier thus allowing existing devices that operate in accordance with the legacy communication protocol and rely on envelope-detection based AM demodulation to continue to operate with the modified protocol without being affected. Although this backward compatibility property of the communication protocol of the present invention may represent a practical need when upgrading an existing system, the scope of the invention is not limited to the use of this combined modulation scheme and to operation in conjunction with an existing communication protocol.

Legacy receivers are typically adapted to receive the legacy pulse width modulated/amplitude modulation through relatively simple envelope detection, which is unaffected by the phase modulation of the present invention. This is because there are no phase transitions introduced during the high-amplitude portion pulses, which could result in bandwidth expansion and consequently in reduced power passing through the narrowband filtering used in these receivers.

The enhanced robustness offered by the present invention, resulting in reliable reception at lower SNIR values with respect to those required for proper operation of prior art devices, is a result of the use of (1) a known synchronization sequence having good autocorrelation properties; (2) coding that allows for error detection and correction within the fields of information bits that are part of each data frame; and (3) a superior phase modulation scheme (e.g., binary phase shift keying (BPSK)). The BPSK modulation, in particular phase reversal keying (PRK), representing an antipodal system, is known to offer the largest distance in the signal space with respect to the signal's power, whereas the historical modulation schemes that are used for time broadcasting worldwide are based on pulse width modulation that relies on amplitude demodulation, requiring a higher SNIR to achieve the same decision error probability or bit error rate (BER) in the presence of additive white Gaussian noise (AWGN).

Furthermore, the AM/pulse-width based prior art system is highly susceptible to on-frequency interference of the type that is experienced as a result of intentional and non-intentional emissions that may be received by the receiver and interfere with its operation. In contrast, the modulation scheme and method of reception of the present invention allow for operation in the presence of relatively strong on-frequency interference.

Further enhanced performance in particularly low SNIR conditions is achieved in the system of the present invention through the accumulation of multiple frames, each of which spans one minute. For example, in one embodiment of the present invention, the contents of 60 consecutive frames in one hour differ only in the 6-bit field dedicated to the encoding of the minutes and the 5-minute field dedicated to the parity of the time word. The results from demodulating all other bits in the frame may be averaged to arrive at a 60×(18 dB) improvement factor in the SNR.

The time information recovered from the signal received through the antenna is typically used in a radio-controlled-clock (RCC) device to either initialize or track the time in the application based on the RCC. Note that this information, at least initially, may be made available to the application from sources other than the broadcast, such as through factory setting, manual setting by the user, or some form of conveying the time to the application either wirelessly or through a physical connection that alleviates the need to receive this information from the broadcast signal. Such means for initializing the time in the application are particularly beneficial in scenarios where the reception of the broadcast may be marginal and the recovery of such information from it may be difficult, whereas time-tracking, based on correlating against the known synchronization word in the frame, is possible even at much lower SNIR values.

Information may also need to be recovered from the broadcast signal in order to verify the schedule for the upcoming daylight-saving-time (DST) transition or for other information that may be embedded in the frame. This may, however, be very infrequent or not necessary at all, if the application does not need such additional information and only needs to maintain synchronicity with other devices and/or the broadcast which represents the accurate time.

The timing information embedded in the broadcast may be extracted from it through a correlation operation against a known synchronization sequence. Such operation is more robust in nature and may be successful at SNIR values that are considerably lower than those necessary for reliable recovery of individual information bits. Therefore, the extraction of the timing information from the signal, which the application may require periodically in order to compensate for natural drifts in its internal timing source, can often be accomplished even in scenarios where the recovery of new information may not be possible. The frequency at which the application may turn on the receiver and attempt to extract the timing information depends on its needs and can vary from multiple times per day to once a week or even more infrequently.

The timing information may be extracted through the reception of a portion of the frame, rather than a whole frame, allowing the device to minimize the energy consumption associated with this operation.

Once the time information has been acquired and is known at the receiving end, the information fields may be used in addition to the known synchronization fields for the purpose of determining timing through the use of correlation. If, for example, a device that is already set to the correct time (including the minute) initiates a reception for the purpose of adjusting for a few seconds in possible timing drift experienced by it, it may correlate the received signal against the contents of an entire frame, such that if the synchronization sequence is allocated 12 seconds, for example, and the entire frame is of 60 second duration, a gain of 5 (7 dB) is obtained through such extended correlation. This allows for reasonably accurate timing corrections to be performed at extremely low SNIR values, for which the probability of error in the recovery of individual 1-second bits would be intolerably high.

Note that an RCC receiver incorporating the system and methods of the present invention may be implemented in any type of timekeeping device. The timekeeping device may comprise a watch; an alarm clock; a wall clock, a utility meter; a microwave oven; a car radio that can display the time; a timekeeping device that acquires its initial timing (sets its time) based on the reception of a phase-modulated data frame where coding is employed to allow for the detection and correction of errors in the time information; wherein the device can correct at least one bit that is received in error; or where the detection of one error or more in the received frame results in a reception of at least part of the next frame, in order to verify that the time information extracted from the first frame is correct; a timekeeping device that determines anytime during the daylight-saving time (DST) period when the DST period is about to end, based on extracting that data from a coded field the broadcast, which serves to support several possible schedules, and schedules a minus one hour (or plus one hour) correction to the appropriate instance (typically 2 AM on a particular Sunday), without having to receive the time around the instance of transitioning out of or into DST.

The timekeeping device may comprise a timekeeping device that determines before the DST period when the DST is about to start, based on extracting that data from a coded field in the broadcast, which serves to support several possible schedules, and schedules a plus one hour correction to the appropriate instance (typically 2 AM on a particular Sunday becomes 3 AM), without having to receive the time around the instance of transitioning into DST.

The timekeeping device may schedule its reception window to an instance in time where a known sequence is to be received, preferably with good autocorrelation properties, allowing the receiver to synchronize with it, i.e. determine the timing of the received signal through a correlation operation and adjust the device's time accordingly, thereby compensating for drifts that may have been experienced in it since the last synchronization opportunity, where the width of the reception window and the corresponding duration of the correlation operation are limited based on the estimated drift that is to be compensated for, such that power consumption associated with the reception is minimized; or where the width of the reception window and the corresponding duration of the correlation operation are limited based on the signal-to-noise-and-interference (SNIR) conditions, such that sufficient signal energy is involved in the correlation operation to allow for adequate synchronization, while avoiding overly extended durations that may result in excessive power consumption in the receiver.

A high level block diagram illustrating an example timing and time information transmitter system operating in accordance with the present invention is shown in FIG. 1. The equipment at the transmitter end, generally referenced 10, comprises a high accuracy clock source (frequency source) 12 from which a clock signal (timing information) is derived, a time-code-generator 14 having user-interface 16, a source of time data 13, a transmitter 18 generating a TX signal 19 and coupled to transmitting antenna 11.

The time code generator 14 keeps track of time based on the high-accuracy frequency source input to it from source 12, constructs the frames of data representing the time information received from time data source 13 and other information that is to be transmitted, modulates the data frames onto the RF carrier in accordance to a defined protocol and allows time initialization and other controls to be set in it through its user interface 16. The transmitter 18 amplifies the modulated signal to generate an output TX signal 19 at the desired levels, e.g., 50 kW, and drives the antenna 11 that is used for the wide-coverage omnidirectional broadcasting of the signal.

Figure 2:
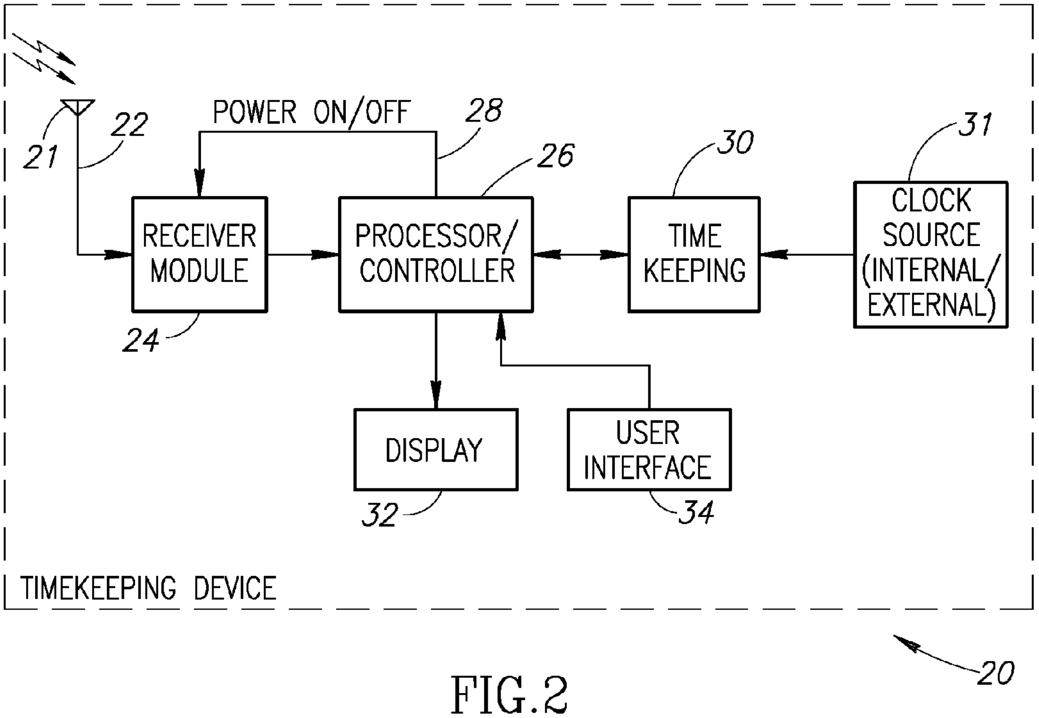
FIG. 2 is a high level block diagram illustrating an example timing and time information receiver constructed in accordance with the present invention.

A high level block diagram illustrating an example timekeeping device constructed in accordance with the present invention is shown in FIG. 2. Typically, the timekeeping device is incorporated into low cost consumer market products, but may be implemented in any device that requires a precision time reference. The timekeeping device, generally referenced 20, comprises receiving antenna 21, receiver module 24 operative to receive RX signal 22, processor and controller 26, timekeeping function 30, internal or external clock source 31, display 32 and user interface 34.

In one embodiment, the timekeeping RCC device, whose receiver demodulates one or more of the phase-modulation schemes BPSK/QPSK/MSK, is fabricated using CMOS technology and may be incorporated into a larger SoC that could comprise functionality beyond that of the RCC and timekeeping functions.

The receiver module 24 extracts timing and time information from the received signal 22, in accordance with the modulation scheme and protocol in use (described in more detail infra), and provides the processing and control function 26 with the extracted timing and time information. Controller function/processor 26 appropriately enables/disables the operation of the receiver module through control line 28 such that it is limited to the intervals of interest to minimize energy consumption in those applications where it may be critical to do so (e.g., wrist watches). The timekeeping function 30 keeps track of the time based on pulses provided by clock source 31 having limited accuracy. Note that the clock source 31 may comprise any suitable clock source or clock signal such as a crystal oscillator and may be provided internal to the timekeeping device 20 or supplied from a source external to the timekeeping device.

The timekeeping may be adjusted by the processor/controller in accordance with an estimated drift at a specific instant, which is either measured or calculated or a combination of the two. The display function 32 may be used to display the time as well as various indications to the user, including reception quality, estimated bound for error in displayed time, battery status, etc. The user interface function 34, based on pushbuttons, slide-switches, a touch-screen, keypad, computer interface, a combination therefrom, or any other form of human interface, may be used to set the initial time, define the maximal allowed timing error, the time-zone according to which time is to be calculated, the use of daylight saving time, etc.

In one embodiment of the invention, the timekeeping device is operative to extract timing and time information conveyed in a broadcast signal. Timing information denotes information related to synchronization and tracking and is also used for bit and frame synchronization. Time information denotes information related to the current time being communicated, such as the date and the time of day (hours and minutes), as well as scheduled events, such as an upcoming DST transition, leap second, etc.

Typical currently available time-broadcast signals employ some form of amplitude modulation combined with some form of pulse width modulation (PWM) to send binary data bits. As an example consider the WWVB signal broadcast from Fort Collins, Colo. in the United States of America. The WWVB signal comprises a 60 second frame consisting of 60 bits. Each bit, of one second duration, is sent as a pulse width modulated signal wherein the carrier is transmitted at a low amplitude or a high amplitude for different portions of the bit. The frame also consists of several marker bits spread out evenly through the frame, which serve only to indicate timing and do not convey time information. The existing WWVB system transmits a pulse-width modulated amplitude-shift keyed waveform on a 60 kHz carrier. The one-second duration '0' and '1' symbols are represented by a power reduction of −17 dB at the start of the second for 0.2 s and 0.5 s, respectively.

The invention also comprises a digital phase modulation (PM) receiver operative to perform phase demodulation on a signal that comprises both phase modulation and amplitude modulation, said amplitude modulation resulting in a portion of the symbol being transmitted at a low level while the remaining portion is transmitted at a higher level.

The low level may be zero, thus reducing the amplitude modulation to on-off-keying (OOK). The symbol time may be one second and the low-level portion of the transmitted symbol is its first 0.1 seconds, 0.2 seconds, 0.5 seconds, or 0.8 seconds.

The phase demodulation operation may be limited to a fixed portion of the symbol that is expected to have the high-amplitude. The fixed portion may be the second half of the symbol, thus simplifying the receiver implementation. The duration of the portion of high-amplitude may be predicted based on the knowledge of the exact time, allowing the receiver to time its demodulation duration to the portion of the symbol that is of high amplitude, thus maximizing the energy involved in the phase demodulation operation. Further, the phase modulation may comprise, for example, binary phase shift keying (BPSK), minimum-phase-shift-keying (MSK), phase reversal keying (PRK), quadrature phase shift keying (QPSK), and frequency shift keying (FSK).

The invention also comprises the optimal scheduling of reception instances whereby the RCC establishes, through a learning process, which instances work best for timing adjustments (e.g., 2 AM at night) and at some point moves into steady-state mode, where it only receives at those instances. If receptions deteriorate over time, the RCC may return to the learning mode and attempt other instances too.

The invention also comprises the extraction of an advance schedule for DST transition from the bits designated to that in the frame by using a look-up-table that converts the 6-bit word representing the selected schedule into its actual meaning (e.g., mapping to the first Sunday in November at 2 AM, or whatever the meaning may be).

A timekeeping device that wirelessly acquires and tracks the time provided by a digital broadcast and the protocol of that broadcast, defined by its data frame structure and modulation scheme, is operative to allow for superior performance of the timekeeping devices in terms of range of operation, immunity to interference, ability to operate with lower cost antennas and reduced energy consumption.

The protocol is designed to allow for adaptive operation in the receiver wherein the acquisition and tracking operations may extend over different durations in accordance with reception conditions such that in very low signal-to-noise-and-interference (SNIR) conditions the receiver may extend its duration of reception to accumulate greater amounts of signal energy, thereby allowing it to reliably extract time and timing information from the broadcast signal.

In one embodiment, error correction coding is employed to allow for various levels of error detection and correction in the various fields of a transmitted packet. A dedicated field in the broadcast signal is decoded in a nonlinear fashion, providing the receiver with a reliable indication of when the next daylight-saving time (DST) transition is to take place. This allows it to employ very infrequent periodic receptions of the full frame of the broadcast signal (e.g., once every few months), whenever energy savings are needed, and to limit its more frequent periodic operation to a short known portion of the frame for the purpose of fine timing corrections.

In one embodiment, the radio controlled clock (RCC) receiver is operative to receive and decode a signal transmitted in accordance with the protocol described supra. Such a receiver is operative, inter alia, to extract the DST schedule from the DST related specific bits within the frame, decode the bits using the look-up-table provided supra and schedules the one-hour adjustment accordingly.

Figure 3:
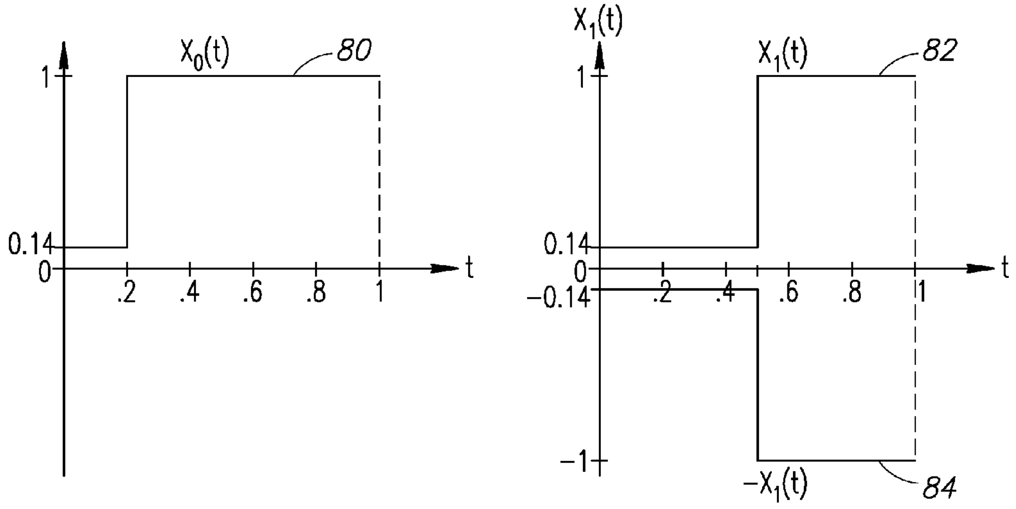
FIG. 3 is a diagram illustrating an example embodiment of phase modulation, shown at baseband, added to a pulse width amplitude modulated carrier.

In one embodiment of the invention, phase modulation is added to an amplitude modulated carrier. A diagram illustrating phase modulation added to an amplitude modulated carrier in an example communication protocol is shown in FIG. 3. This diagram describes the amplitude/pulse width modulation (PWM) used in the historical WWVB broadcast as well as the phase modulation introduced in accordance with an embodiment of the present invention. The diagram shows the baseband representation of the '0' and '1' symbols in both the historical WWVB modulation and in one that is modified in accordance with an example embodiment of the present invention. It is noted that the enhancement in the communication protocol offered by the present invention, in the form of independently defined phase modulation and the use of a known synchronization sequence, is not limited to the broadcast of WWVB and may be applied to other timing/time information broadcast systems such as those in other countries around the world where similar AM/pulse-width schemes are used or where no AM/pulse-width modulation needs to be supported, allowing for continuous BPSK to be used. Note that the receiver may be operative to receive and decode any phase over amplitude modulated transmitted signal that has time synchronization and time information conveyed therein.

In one embodiment, the additional phase modulation added to the signal is binary phase shift keying (BPSK) having an 180° difference in the carrier's phase between the '0' and '1' symbols, also known as antipodal phase modulation or Phase Reversal Keying (PRK). Hence, the modulated waveforms representing these symbols may be expressed as the products of the sinusoidal 60 kHz carrier (in the case of WWVB) and the baseband waveforms $s_0(t)=x_0(t)$ (waveform 80) and $s_1(t)=-x_1(t)$ (waveform 84), respectively, as shown in FIG. 3. Waveform 82 represents the original '1' symbol $s_1(t)=x_1(t)$ that is replaced by its inverse waveform 84 in one example embodiment of the present invention. As is shown in FIG. 3, the enhanced modulation scheme can be accomplished through simple sign inversion for the waveform representing the '1' symbol. It is noted that since the existing envelope detector based receivers designed to receive and decode the current WWVB AM/PWM based broadcast signal do not consider the carrier's phase, they are not impacted by the modification of phase inversion of the '1' symbol.

Figure 4:
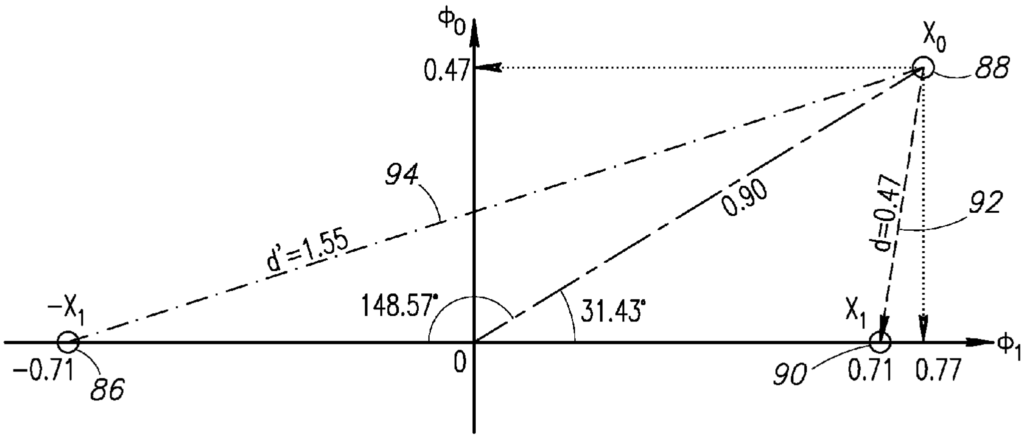
FIG. 4 is a diagram illustrating the signal space representation of the prior art AM/pulse-width '0' and '1' signals, as well as that of an example embodiment of the present invention, where Phase-Reversal-Keying (PRK) is added onto the AM/pulse-width modulation.

A diagram illustrating the signal space representation of AM only and PM over AM '0' and '1' symbols is shown in FIG. 4. As shown in the diagram, the new pair of waveforms, $x_0$ (referenced 88) and $-x_1$ (referenced 86), having the same amount of energy (corresponding to their distances from origin), exhibit a much greater distance between the '0' and '1' symbols (as compared to waveform pair $x_0$ and $x_1$ (referenced 90), thereby allowing for more robust reception in the presence of additive noise. Note that the existing symbols $x_0$ and $x_1$ are strongly correlated, i.e. they have a very short distance between them in the signal space with respect to their energies.

The Euclidean distance between the two amplitude modulated waveforms $x_0$ and $x_1$ is shown to be 0.47, whereas the Euclidean distance for the two phase modulated waveforms $x_0$ and $-x_1$ increases to 1.55. Therefore, the modulation gain (denoted $m_g$) representing the power ratio by which the detection capability in the presence of additive noise is improved, is given by $$\begin{aligned} m_g &= 20\log_{10}\left(\frac{1.55}{0.47}\right) \\ &= 10.36 \text{ dB} \end{aligned} \tag{1}$$

Thus, by simply adding such phase modulation, an order of magnitude of improvement may be achieved when assuming additive white Gaussian noise (AWGN). This analysis implicitly assumes that the receivers for both schemes would be optimal, i.e. based on correlation or matched filtering. In practice, the BPSK receiver may be implemented digitally in a near-optimal fashion, whereas the receivers for the existing AM/pulse-width scheme found in consumer-market products, not designed as a classical digital-communications system, are based on envelope detection, as previously noted. This adds an additional gap of 2 to 4 dB between the two when only AWGN is considered. In the presence of on-frequency interference, however, the gain offered by realizing a near-optimal BPSK receiver may be arbitrarily higher. Furthermore, additional gains can be offered, such as (1) through encoding of the information, and (2) use of a known synchronization sequence.

In an embodiment of the present invention, the information represented by the phase modulation in each bit is independent from that represented by the existing (legacy) AM/pulse-width modulation, such that an inverted phase would not necessarily be tied to the shorter waveform 82, represented by inverted waveform $-x_1(t)$ 84 in FIG. 3. In an example embodiment, with independent data being communicated through the carrier's phase, a phase inverted bit, which may represent a "1", for example, may be combined with either a "0" or a "1" in the AM/PWM signal.

The receiver extracting the information from the phase may limit the phase demodulation operation to the last 0.5 sec of each bit, where both the "0" and "1" symbols of the AM/PWM scheme shown in this example are at high amplitude. Alternatively, in order to gain from the additional energy in the longer "0" pulses (0.8 sec in this example), the receiver may extend the demodulation of phase during those symbols to 0.8 sec when the content is of the AM/PWM modulation is known to be "0". In the existing WWVB protocol, for example, there are several such bits fixed at "0". Additionally, when a device operating in accordance with the present invention has already acquired the time and is tracking it, its reception of the phase modulated information may consider the predicted durations of the time-information bits as they are defined by the particular AM/PWM protocol, thereby further optimizing reception.

In an alternative embodiment, non-antipodal phase modulation can be used to modulate the PWM signal. For example, the magnitude of phase modulation applied may be set at any value less than 180°, e.g., ±45°, ±25°, ±13°, etc. Use of a lower value such as ±13° ensures that the modulated signal, even if the rate of phase modulation were significantly increased, is contained within a narrow bandwidth and does not escape the narrow filtering in typical existing AM receivers, which is on the order of 10 Hz. Note that such narrowband PM is not comparable in performance to antipodal BPSK, where the two symbols are 180° apart exhibiting a correlation factor of −1.

Figure 5A:
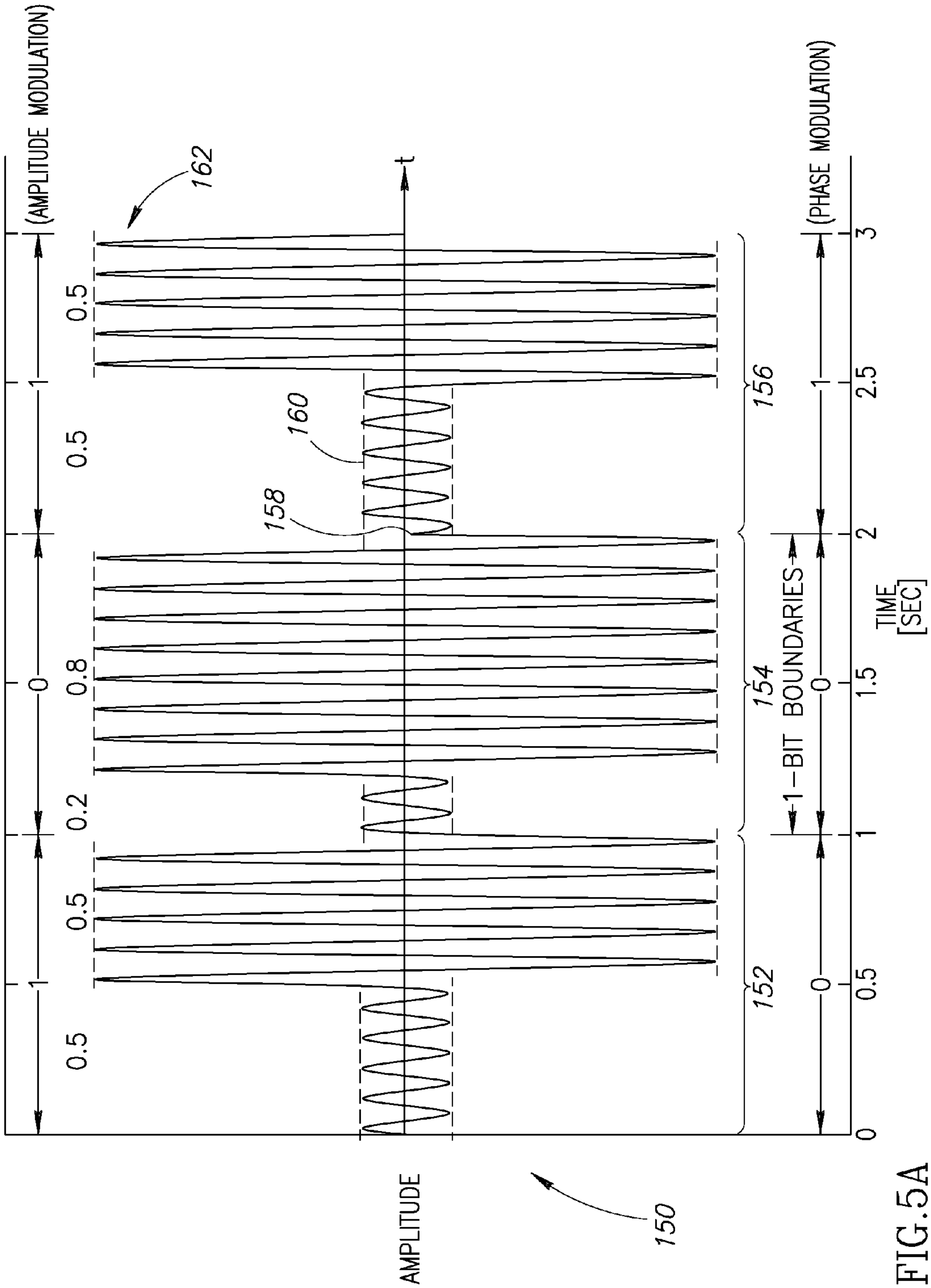
FIG. 5A is a diagram illustrating a first example waveform of phase modulation added to an amplitude/phase modulated carrier in an example communication protocol.

A diagram illustrating a first example phase modulation added to an amplitude modulated carrier in an example communication protocol is shown in FIG. 5A. The waveform illustrates three consecutive example bits in the transmission as a time-domain waveform 150. The three bits 152, 154 and 156 each span a duration of one second. Each of the one second bits is divided into a first portion 160 for which the carrier power is low and a second portion 162 for which the carrier power is high. In the WWVB protocol, the information in each bit depends on the durations of these two portions with an even 0.5/0.5 sec partition representing a "1" bit, and the uneven 0.2/0.8 sec partition representing a "0" bit. A 0.8/0.2 sec partition represents a 'marker' bit, which may be used for timing identification, but does not carry information. The bits represented under the legacy PWM/AM modulation are indicated at the top portion of the diagram. For example, the three PWM/AM bits shown are "1", "0" and "1".

In accordance with an embodiment of the present invention, information is added to the existing modulation using BPSK modulation. A "1" is represented by a carrier having an inverted phase, with the phase inversion 158 occurring at the beginning of the bit, as shown for the third bit 156 at t=2 sec. It is noted that the phase inversion may also be performed at any other instance, e.g., during the low amplitude portion of the carrier, if the receiver's phase demodulation operation is limited to the high-amplitude duration and disregards the low amplitude portion. While the information represented by the pulse widths is shown to be "1", "0", "1", the information that is sent in parallel, in accordance with the example BPSK (or PRK) protocol of the present invention, is shown to be "0", "0", "1" (as shown along the bottom portion of the diagram). Note that there is not necessarily any relationship between the bit pattern transmitted using PWM/AM and that transmitted using PM as they can be completely independent. It is noted that the carrier frequency is not shown to scale in the figure to enhance clarity, but it is preferable for the phase transitions to occur at zero crossing instances of the carrier.

Figure 5B:
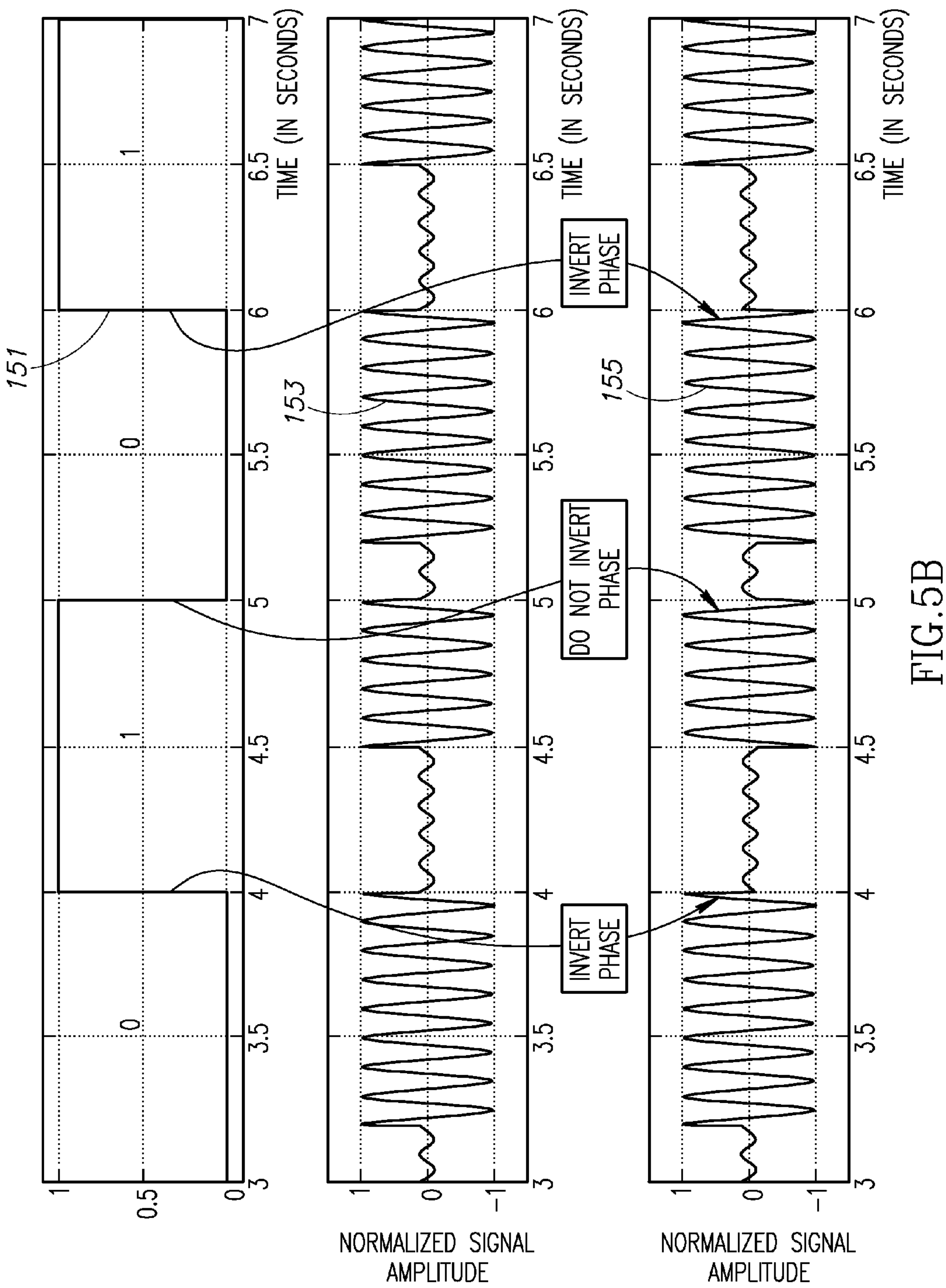
FIG. 5B is a diagram illustrating a second example waveform of phase modulation added to an amplitude/phase modulated carrier in an example communication protocol.

A diagram illustrating a second example phase modulation added to an amplitude modulated carrier in an example communication protocol is shown in FIG. 5B. The waveform illustrates four consecutive example bits in the transmission as a time-domain waveform 151. The four bits each span a duration of one second. Each of the one second bits is divided into a first portion for which the carrier power is low and a second portion for which the carrier power is high. The bits represented under the legacy PWM/AM modulation are indicated in waveform 153 in the middle portion of the diagram. For example, the three PWM/AM bits shown are "0", "1", "0" and "1". The same bit pattern is represented in the phase modulation over PWM/AM waveform 155 shown in the lower portion of the diagram. As shown, the phase of the carrier is inverted for the "1" bits. Note that the data transmitted using legacy PWM/AM may be completely independent of the data transmitted using PM. In this example they are the same.

The diagram in FIGS. 5A and 5B describe the amplitude/pulse-width modulation used in the historical WWVB broadcast, as well as the phase-modulation introduced in accordance with the present invention. It is noted that the enhancement in the communication protocol offered by the present invention, in the form of independently defined phase modulation and the use of a known synchronization sequence, is not limited to the broadcast of WWVB and may be applied worldwide, where similar AM/pulse-width schemes are used or where no AM/pulse-width modulation needs to be supported, allowing for continuous BPSK to be used.

The phase modulation added to the amplitude modulation may comprise any suitable type of phase modulation including, for example, BPSK, DBPSK, PRK, PM, MSK, and FSK. In addition, the underlying amplitude modulation may comprise any type of amplitude modulation, including, for example, ASK, AM, SSB, QAM, pulse position modulation (PPM), pulse width modulation (PWM), OOK, and ASK.

Figure 6:
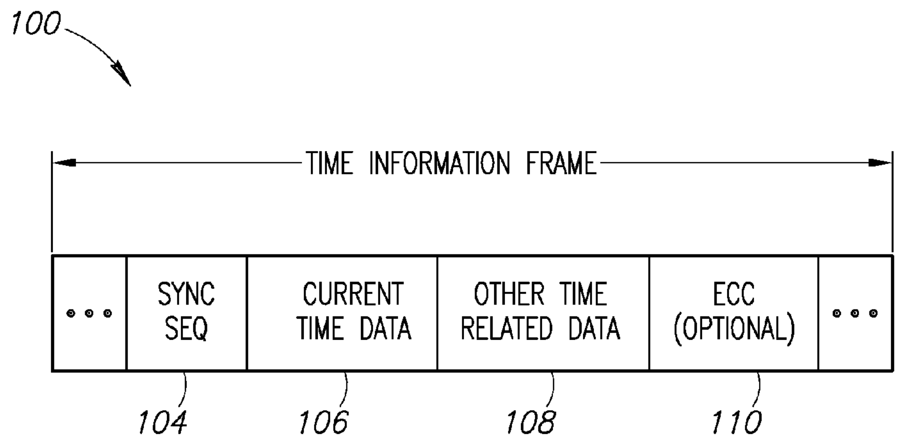
FIG. 6 is a diagram illustrating a first example time information frame structure incorporating timing, time and additional information.

A diagram illustrating a first example time information frame structure incorporating timing, time and additional information is shown in FIG. 6. The time information frame, generally referenced 100, comprises a synchronization sequence field 104, a current time data field 106, other time related data field 108 and optional error correction code (ECC) field 110. In one embodiment, each time information frame spans 60 seconds. Frames having other durations are possible as well.

The synchronization sequence field 104 comprises a known synchronization sequence (e.g., barker code, modified barker code, pseudo random sequence, or any other known word or bit/symbol sequence) at a known timing within the one minute time information frame of 60 bits that is transmitted every 60 seconds. Note that in alternative embodiments the synchronization sequence may be placed within a frame N, such that it overlaps or straddles the frame N−1 before it or frame N+1 after it.

The current time data field 106 may consist of a merged date and time of day field or may be broken down into individual sub-fields used to indicate date, year, hours, minutes, etc. The other time related data field 108 may include zero or more fields used to indicate, daylight savings time start, leap second information, etc.

Figure 7:
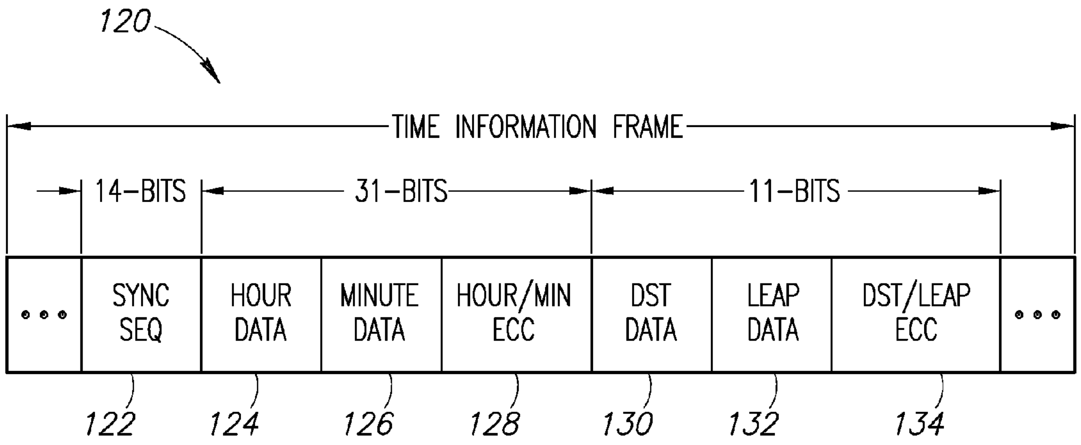
FIG. 7 is a diagram illustrating a second example time information frame structure incorporating timing, time and additional information.

A diagram illustrating a second example time information frame structure incorporating timing, time and additional information is shown in FIG. 7. The time information frame, generally referenced 120, comprises a synchronization sequence field 122, an hour data field 124, minute data field 126, optional hour/minute ECC field 128, daylight savings time (DST) data field 130, leap second data field 132 and DST/leap second ECC field 134. In one example, the synchronization sequence field 122 spans 14-bits; the combined hour data field 124, minute data field 126 and hour/minute ECC field 128 span 31-bits in a merged time data field; and the DST data field 130, leap second field 132 and DST/leap second ECC field 134 comprising an additional information field, spans 11-bits in total.

Figure 8:
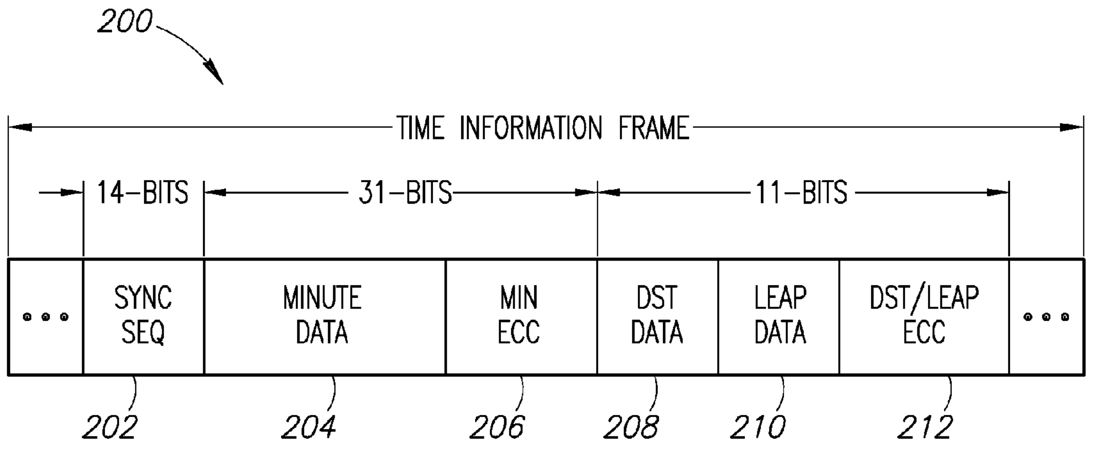
FIG. 8 is a diagram illustrating a third example time information frame structure incorporating timing, time and additional information.

A diagram illustrating a third example time information frame structure incorporating timing, time and additional information is shown in FIG. 8. The time information frame, generally referenced 200, comprises a synchronization sequence field 202, a minute data field 204, optional minute ECC field 206, daylight savings time (DST) data field 208, leap second data field 210 and DST/leap second ECC field 212. In one example, the synchronization sequence field 202 spans 14-bits; the minute data field 204 and minute ECC field 206 span 31-bits in a merged time data field; and the DST data field 208, leap second field 210 and DST/leap second ECC field 212 comprising an additional information field, spans 11-bits in total.

In the above two versions of the time information frame, the synchronization sequence comprises a 14-bit known sequence. The receivers use this sequence to acquire initial synchronization such as when first powering on. Receivers also use the sequence to track the synchronization timing signal broadcast in the frames in order to adjust their internal timekeeping to maintain synchronization with the transmitter.

As described supra, the addition of phase modulation to the legacy amplitude/pulse-width modulation provides significant performance improvements in the presence of AWGN and RFI. The system benefits even further by representing different information in the phase modulation from that conveyed in the historical amplitude/pulse-width modulation. In order to maximize such benefits, common usages of the received signal have been considered, with the following assumptions being made.

In a first function, which may be called time-acquisition or more simply acquisition, the received signal functions to convey the time of day (and date) to those devices that have not yet acquired it, such as a new wall-clock which has just had its batteries installed. In this scenario, the greatest amount of completely unknown data is assumed to be conveyed, for which the greatest receiver effort may be expected. This data is referred to time information. Once the current time is acquired, the RCC device uses its own timekeeping capability and does not need to repeat the acquisition process.

In a second subsequent function, which may be called timing-tracking or more simply tracking, devices that have already acquired the current time periodically rely on the received signal to compensate for whatever time-drifts that may have accumulated due to the inherent frequency error in their internal or external clock sources (e.g., crystal based oscillator with frequency accuracy typically on the order of ±10 ppm). This would, therefore, be the most common use of the WWVB signal, since an RCC device may require very few acquisition operations in its lifetime, but would regularly depend on the periodic time-adjustments based on the WWVB signal (i.e. tracking). This information in the broadcast signal is referred to as timing information.

In a third function, which may be called event-scheduling, advance notification of the next daylight saving time (DST) transition, i.e. either when entering or exiting DST, is extracted from the broadcast signal, allowing the receiving device to perform the one-hour time shift at the correct instance without having to receive the WWVB signal around the time of the scheduled transition. In devices that display the actual time and in control systems that operate in accordance with it (e.g., pool controllers, irrigation systems, heating/air-conditioning controllers), it is important for the correct time to be considered and hence useful to accommodate this third function. Devices that simply need to maintain synchronicity with one another, however, may not need this. Other information that falls under this category includes the advance notification of an imminent leap second, wherein an indication of the possible presence of a leap second at the end of the current half-year is extracted from the signal. The DST schedule and leap second notification information are referred to as additional or other information.

For each of the three functions (or types of information, i.e. timing, time and additional information) described above an efficient and robust way for representing the information is provided. A diagram illustrating a third example time information frame structure incorporating timing, time and additional information is shown in FIG. 9. The time information frame, generally referenced 140, comprises 60-bits, where each bit is allocated one second of the 60-second frame. The bit designations for both historical amplitude/pulse-width modulation 142 and phase modulation 144 are shown. In this embodiment, the time information is divided into a 26 bit hour and minute word that is encoded into a 31-bit field using a linear block code.

Note that the term phase modulation may denote either (1) phase modulation over (i.e. combined with) the historical amplitude/pulse-width modulation or (2) pure phase modulation alone. Note also that the data fields assigned to each bit in the frame for both amplitude and phase modulation are essentially completely independent. In one embodiment, aspects of the historical amplitude/pulse-width modulation, however, are taken into consideration. For example, the assignment of data to the marker bits of the amplitude/pulse-width modulation is avoided due to the shorter high power duration (0.2 s) of these symbols.

The representation of the information is provided under the constraint of the same 60-second frame defined in the historical WWVB protocol, while also considering the marker symbols in it, which are of lesser energy, having a duration of only 0.2 s of high power. For this reason, the use of the markers is avoided entirely in conveying bits of information and is limited in their use to known components of a synchronization sequence or to redundant information. While three of the seven markers are within the fixed synchronization sequence, the remaining four marker symbols are shown to be reserved (denoted 'R' 146) for future use.

Extracting timing from a digitally modulated received signal is best accomplished when a known sequence, having good autocorrelation properties, is embedded within it. This allows for a correlation operation in the receiver to reveal the timing of the received signal even in low SNIR conditions, for which the recovery of individual bits within the sequence might have involved high error probabilities. The successful identification of the known sequence does not require the recovery of the individual bits comprising it, and directly corresponds to the total energy in the known sequence, which is proportional to its duration. Therefore, the duration of the known sequence in the frame is maximized, while weighing this against the need to send the time information in a robust fashion, i.e. with redundancy. As is shown in the time information frame 140 a total duration of 14 seconds is allocated to the known sequence, starting from the last second of the previous frame and ending 13 seconds into the current frame. Hence, the amount of energy invested in the timing information is on the order of a quarter of the total energy in a 60-second frame.

A diagram illustrating a fourth example time information frame structure incorporating timing, time and additional information is shown in FIG. 10. The bit allocation for the time information frame, generally referenced 170, comprises 60-bits, where each bit is allocated one second of the 60-second frame. The bit designations for both historical amplitude/pulse-width modulation 172 and phase modulation 174 are shown. In this embodiment, the time information is conveyed as a 26-bit minute field that is encoded into a 31 bit field using a linear block code.

Note that the term phase modulation may denote either (1) phase modulation over (i.e. combined with) the historical amplitude/pulse-width modulation or (2) pure phase modulation alone. Note also that the data fields assigned to each bit in the frame for both amplitude and phase modulation are essentially completely independent. In one embodiment, aspects of the historical amplitude/pulse-width modulation, however, are taken into consideration. For example, the time (0) bit (LSB of the minute indication) is repeated over several (e.g., four) marker bits. Non-repetitive information in the marker bits is avoided due to the short high power duration (0.2 s) of these symbols.

Since a device that is in tracking mode typically uses the received signal only to compensate for drift, the LSB of the minute counter may be useful in resolving a timing drift whose magnitude approaches 30 seconds, for which there may be uncertainty in the correct minute. For example, if a timing drift of +27 seconds is established based on the correlation operation against the known sequence word, an actual drift of −33 seconds may be suspected. These two possibilities will differ in terms of the correct minute that is to be assumed, and the ambiguity may be resolved through the reading of the minute's LSB, which may be found in five different locations in the example frame 170, allowing for reliable determination of the value of this bit even in harsh condition of noise and interference.

For example, a receiver may either add the energies of all five minute LSB fields, or may select one or multiple instances of this bit in the frame for which a sufficiently high SNIR has been established. It is noted that successful tracking relies on the result of the correlation operation that the receiver performs against the known synchronization sequence, but this operation benefits from the extended duration of this sequence and from a priori knowledge of its contents. Contrarily, the LSB of the minute counter, denoted TIME[0] in example frame 170, must be resolved through demodulation of the phase during one or more of its instances in the frame. Hence, it is beneficial to allocate multiple instances to this bit of information, providing both an increase in total energy, as well as time-diversity, which is effective against non-stationary noise/interference, as realized in this embodiment of the present invention.

Merged Current Time Word

Rather than allocate a separate field to each element of time (e.g., hour, minute, etc.) and encode this information in BCD format as is done in the historical WWVB protocol where a total of 31 bits are consumed, the current time is represented more efficiently and robustly in a single merged word as defined below.

With reference to FIG. 9, the entire current time information, which includes the minute, hour and date, is allocated a total of 26 bits, to which 5 redundant parity bits are added, which is, by coincidence, the same of number of bits dedicated to the representation of time in the historical WWVB protocol. In this example embodiment of the present invention, within the 26-bit time word, 6 bits are used for a minute counter (0-59) and the remaining 20 bits represent the number of hours that have elapsed since the beginning of the current century.

The number of hours in a century is limited to 100×365.25×24=876,600. Thus, the 20-bit field is used efficiently since $\log_2(876600)=19.74$. The 6-bit portion representing the minute is also used efficiently since $\log_2(60)=5.9$, which is very close to 6 (60 of the possible 64 combination are used).

Alternatively, in another embodiment, with reference to FIG. 10, the minute within the century is specified in the 26-bit time word. The number of minutes in a century is limited to 100×365.25×24×60=52,596,000. Thus, the 26-bit field is used efficiently since $\log_2(52{,}596{,}000)=25.64$.

In both embodiments, the 26-bit time word is encoded into a 31-bit code-word using an error correcting code such as a well-known Hamming systematic block code. This linear block code has the capability to correct a single error that may occur in any of the 31 bits and the capability to detect up to two errors. If three errors were to occur, the received 31-bit word may appear like a legitimate one, resulting in erroneous decoding. Such a scenario is considered intolerable and the system is thus designed to minimize the probability of such an event occurring. If, for example, the BER is on the order of $10^{-2}$ (1%), the probability for three errors is on the order of $10^{-6}$, which is considerably lower.

In one embodiment, the block code used is a systematic code, which means that the input data is embedded in the encoded output and may be read directly from the output without requiring any decoding. This property does not come at the cost of performance, while it allows for simplified testing and reception (i.e. elimination of the decoding procedure, particularly for high SNR).

A block code may be denoted as a (n, k) code, where n and k denote the code-word size and the number of information bits respectively. For the time word in these two embodiments n=31 and k=26. The equations below specify how each of the five parity bits, denoted "timepar[i]" (i=0, 1, 2, 3, 4), is to be calculated using the 26 bits comprising the time word denoted "time[k]" (k=0, 1 . . . , 25).

timepar[0]=$\text{sum}_{(modulo\ 2)}${time[23,21,20,17,16,15,14,13,9,8,6,5,4,2,0]} timepar[1]=$\text{sum}_{(modulo\ 2)}${time [24,22,21,18,17,16,15,14,10,9,7,6,5,3,1]} timepar[2]=$\text{sum}_{(modulo\ 2)}${time [25,23,22,19,18,17,16,15,11,10,8,7,6,4,2]} timepar[3]=$\text{sum}_{(modulo\ 2)}${time [24,21,19,18,15,14,13,12,11,7,6,4,3,2,0]} timepar[4]=$\text{sum}_{(modulo\ 2)}${time [25,22,20,19,16,15,14,13,12,8,7,5,4,3,1]}

Syndrome based decoding, wherein a syndrome vector is calculated based on the received word in a linear fashion, can be used in the receiver. A non-zero syndrome indicates that at least one error occurred in the received word. For this Hamming code, the syndrome can correctly indicate the error location if only one error occurs in the received word. In order to guarantee the reliability of the recovered information, the receiver does not necessarily have to correct the received word when the syndrome is non-zero. Instead, a second reception, confirming the contents of the first, may be used, resulting in increased reliability at the cost of delayed acquisition. Thus, the error detection capability may, in some instances, be considered more important than the correction capability.

Since it is probable to have more than one error in the received word in low SNR scenarios, an erasure may occur and the receiver can make a second acquisition attempt. In contrast, in high SNR scenarios, where the likelihood of having two or more errors is very low, a correction may be made, which is more energy-efficient than repeated reception.

An analysis of linear versus nonlinear coding schemes for the phase modulation based protocol in the presence of AWGN is provided below.

The 26-bit time word represents the timing information including the minute, hour and date. It is encoded into a 31-bit codeword using a Hamming systematic block code. A Hamming code is a linear block code that has single error correcting and double error detecting capabilities. Hamming codes can be systematic or non-systematic. A systematic code indicates that the input data is embedded in the encoder output. For any positive integers $n-k=m\geqq 3$, there exists a Hamming code with the following parameters:

Code length: $n=2^m-1$

Number of information bits: $k=2^m-m-1$

Number of parity-check bits: $n-k=m$

Minimum Hamming distance: $d_{min}=3$

Where n denotes the block size and k denotes the number of information bits and the resulting block code is usually denoted as a (n, k) code. In the system described herein, n=31 and k=26.

The encoder of a Hamming code uses vector matrix multiplication. If $u=(u_0, u_1, \ldots, u_{k-1})$ is the message to be encoded, the corresponding codeword $v=(v_0, v_1, \ldots, v_{n-1})$ is given as follows $$v=u\cdot G \tag{2}$$

Where matrix G is called a generator matrix with dimension k×n. There is a one-to-one mapping relationship between the generator matrix G and the parity check matrix H used by the decoder.

Similar to the encoder, the decoder of a Hamming code also uses vector matrix multiplication, except that the matrix used is called parity check matrix and is usually denoted H. The parity check matrix H for the Hamming code is a n×(n−k)

matrix consisting of all the non-zero m-tuples as its columns. In systematic form, the columns of H are arranged in the following form:

$$H=[I_m Q] \quad (3)$$

where $I_m$ is a m×m identity matrix, and the submatrix Q consists of $k=2^m-m-1$ columns that are the m-tuples of Hamming weight two or more. The Hamming weight of a binary codeword refers to the number of '1's in it. The parity check matrix is shown in Table 1 below.

TABLE 1

Parity Check Matrix H for the (31, 26) Systematic Hamming Code

| | | bit on input (coded) word of 31 bits | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| | | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
| bits on | 4 | 1 | 0 | 0 | 0 | 0 | 1 | 0 | 0 | 1 | 0 | 1 | 1 | 0 | 0 | 1 | 1 | 1 | 1 | 1 | 0 | 0 | 0 | 1 | 1 | 0 | 1 | 1 | 1 | 0 | 1 | 0 |
| output | 3 | 0 | 1 | 0 | 0 | 0 | 0 | 1 | 0 | 0 | 1 | 0 | 1 | 1 | 0 | 0 | 1 | 1 | 1 | 1 | 1 | 0 | 0 | 0 | 1 | 1 | 0 | 1 | 1 | 1 | 0 | 1 |
| syndrome | 2 | 0 | 0 | 1 | 0 | 0 | 1 | 0 | 1 | 1 | 0 | 0 | 1 | 1 | 1 | 1 | 1 | 0 | 0 | 0 | 1 | 1 | 0 | 1 | 1 | 1 | 0 | 1 | 0 | 1 | 0 | 0 |
| of 5 bits | 1 | 0 | 0 | 0 | 1 | 0 | 0 | 1 | 0 | 1 | 1 | 0 | 0 | 1 | 1 | 1 | 1 | 1 | 0 | 0 | 0 | 1 | 1 | 0 | 1 | 1 | 1 | 0 | 1 | 0 | 1 | 0 |
| | 0 | 0 | 0 | 0 | 0 | 1 | 0 | 0 | 1 | 0 | 1 | 1 | 0 | 0 | 1 | 1 | 1 | 1 | 1 | 0 | 0 | 0 | 1 | 1 | 0 | 1 | 1 | 1 | 0 | 1 | 0 | 1 |

For a systematic Hamming code, the generator matrix G can be expressed as $$G=[Q^T I_k] \quad (4)$$

The generator matrix G is shown in Table 2 below.

TABLE 2

Generator Matrix G for the (31, 26) Systematic Hamming Code

| | | Bit on output (coded) word of 31 bits | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| | | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
| bit | 25 | 1 | 0 | 1 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| on | 24 | 0 | 1 | 0 | 1 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| in- | 23 | 0 | 0 | 1 | 0 | 1 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| put | 22 | 1 | 0 | 1 | 1 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| (un- | 21 | 0 | 1 | 0 | 1 | 1 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 |
| cod- | 20 | 1 | 0 | 0 | 0 | 1 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 |
| ed) | 19 | 1 | 1 | 1 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 |
| word | 18 | 0 | 1 | 1 | 1 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 |
| of | 17 | 0 | 0 | 1 | 1 | 1 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 |
| 26 | 16 | 1 | 0 | 1 | 1 | 1 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 |
| bits | 15 | 1 | 1 | 1 | 1 | 1 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 |
| | 14 | 1 | 1 | 0 | 1 | 1 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 |
| | 13 | 1 | 1 | 0 | 0 | 1 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 |
| | 12 | 1 | 1 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 |
| | 11 | 0 | 1 | 1 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 |
| | 10 | 0 | 0 | 1 | 1 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 |
| | 9 | 0 | 0 | 0 | 1 | 1 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 |
| | 8 | 1 | 0 | 1 | 0 | 1 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 |
| | 7 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 |
| | 6 | 0 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 |
| | 5 | 1 | 0 | 0 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 |
| | 4 | 1 | 1 | 1 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 |
| | 3 | 1 | 1 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 |
| | 2 | 0 | 1 | 1 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 |
| | 1 | 1 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 |
| | 0 | 0 | 1 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 |

Syndrome based decoding is a general decoding scheme for linear block codes where the syndrome S can be computed by $$S=r\cdot H^T \quad (5)$$

Where r is the received word. A non-zero syndrome indicates that at least one error occurred in the received word. For the Hamming code, the error location is the index of the column in H which is identical to the syndrome S.

In order to guarantee the correctness of the retrieved information, however, the receiver does not necessarily attempt to correct the received word when the syndrome is non-zero. The reason is that the correction based on syndrome decoding is reliable only when there is one error in the received word, otherwise the receiver will mistakenly correct the received word to the wrong codeword. Since it is probable to have more than one error in the received word in low SNR scenarios, an erasure may occur and the receiver can make a second acquisition attempt. In contrast, a correction can be made in high SNR scenarios, where the likelihood of having two or more errors is very low. The above correction mechanism involves an SNR threshold and a trade-off between the block error rate and the cost of making a second acquisition attempt. In the analysis provided herein, it is assumed that the receiver only makes one acquisition attempt and tries to correct the error whenever the syndrome is non-zero.

Given a signal-to-noise-ratio (SNR), the probability of a bit error for BPSK is given by $$P_{bit\_error}=Q(\sqrt{2\times\text{SNR}}) \quad (6)$$

Where the noise power N is measured in bandwidth $B=R_b$, which is equivalent to $$SNR = \frac{E_b}{N_o}$$

with $E_b$ being the energy per bit $$\frac{N_o}{2}$$

being the power spectral density of the AWGN, and Q(x) being the tail probability of the normal distribution, i.e.

$$Q(x) = \frac{1}{\sqrt{2\pi}} \int_x^{\infty} \exp\left(-\frac{u^2}{2}\right) du \quad (7)$$

The word error rate (WER) of the uncoded minute counter can be calculated using $$P_{word\_error} = 1-(1-P_{bit\_error})^k \quad (8)$$

When coded using a linear block code, a decoding error occurs when there are two or more errors in the received word. Therefore, the WER for the coded time word using the Hamming code can be calculated as follows $$P_{decoded_{word}} = 1-(1-P_{bit_{error}})^n - nP_{bit_{error}}(1-P_{bit_{error}}) \quad (9)$$

Figure 11:
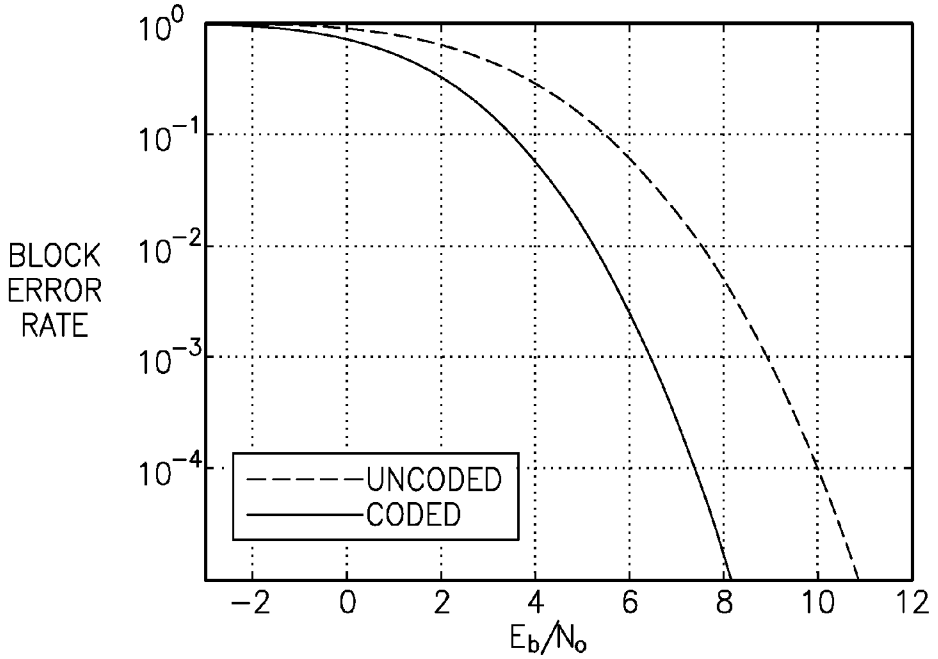
FIG. 11 is a graph illustrating the word error rate comparison for coded and uncoded versions of the time data field.

Whenever at least one bit in a word is recovered in error (despite the coding) this represents a time word error event, for which the word error probability (WER) is defined. The WER comparison for the coded and uncoded time word (merged time data field) is shown in FIG. 11. It is noted that a WER of $10^{-3}$ corresponds to one error in 100 years even if time acquisition is performed 10 times in a year. The demodulation SNR for this WER is shown to be about 8.9 dB for the uncoded word and 6.4 dB for the coded word representing a coding gain of 2.5 dB.

Additional Information Field

The additional information field comprises seven bit (before any error correcting codes are applied). The 7-bit additional information field comprises one bit indicating whether DST is in effect or not, one bit indicating whether a leap-second is to be added at the end of the current half-year and a 5-bit DST schedule word, which serves to indicate the time and day for the next DST transition. With error correcting codes applied, the additional information field consists of 11 bits {dston, leap, dlpar[0], dlpar[1], dlpar[2]} and {dst[0], dst[1], . . . , dst[5]}. The additional information field is primarily used to communicate the DST state and the schedule for the upcoming DST transition (i.e. either entering or exiting DST). This field is based on two information words of 2-bits and 5-bits that are encoded into 5 bits and 6 bits, respectively, for error detection and correction.

The additional information that may be communicated through this field includes a leap second notification, emergency messages, and whatever other information that is desired to be conveyed. Table 3, Table 4, Table 5 and Table 6 specify the bit designations and how the information in this field is used and interpreted.

TABLE 3

DST State (Bit 6)

| dston | Description |
|---|---|
| 0 | DST not in effect (OFF); next transition is into DST (use Column C in Table 6) |
| 1 | DST in effect (ON); next transition is out of DST (use Column B in Table 6) |

TABLE 4

Leap Second Notification (Bit 5)

| leap | Description |
|---|---|
| 0 | no leap second scheduled at the end of this half-year |
| 1 | leap second scheduled for this half-year (the earlier of June 30$^{th}$ or Dec 31$^{st}$) |

TABLE 5

Bits 4:3 in 5-bit DST Schedule Word

| Bit 4 | Bit 3 | Description |
|---|---|---|
| 0 | 0 | use Column A to decode bits 2:0 (special messages) |
| 0 | 1 | next DST transition hour is 1 AM, day is in bits 2:0 |
| 1 | 0 | next DST transition hour is 2 AM, day is in bits 2:0 |
| 1 | 1 | next DST transition hour is 3 AM, day is in bits 2:0 |

TABLE 6

Bits 2:0 in 5-bit DST Schedule Word

| Bit 2 | Bit 1 | Bit 0 | Column A | Column B (end of DST) | Column C (start of DST) |
|---|---|---|---|---|---|
| 0 | 0 | 0 | DST permanently off | 3$^{rd}$ Sunday before "O" | 6$^{th}$ Sunday since "M" |
| 0 | 0 | 1 | DST permanently on | 2$^{nd}$ Sunday before "O" | 7$^{th}$ Sunday since "M" |
| 0 | 1 | 0 | DST out of range | 1$^{st}$ Sunday before "O" | 8$^{th}$ Sunday since "M" |
| 0 | 1 | 1 | Reserved | last Sunday of Oct. = "O" | 1$^{st}$ Sunday of March = "M" |
| 1 | 0 | 0 | Reserved | 1$^{st}$ Sunday of Nov. | 2$^{nd}$ Sunday since "M" |
| 1 | 0 | 1 | Reserved | 2$^{nd}$ Sunday of Nov. | 3$^{rd}$ Sunday since "M" |
| 1 | 1 | 0 | Reserved | 3$^{rd}$ Sunday of Nov. | 4$^{th}$ Sunday since "M" |
| 1 | 1 | 1 | Reserved | 4$^{th}$ Sunday of Nov. | 5$^{th}$ Sunday since "M" |

Note that the first Sunday in April could be either the 5$^{th}$ or 6$^{th}$ Sunday since the beginning of March. Note also that the last Sunday in October or in March may be either the 4$^{th}$ or the 5$^{th}$ Sunday of that month.

Bit "dston" (dst-on) indicates whether DST is in effect. In the United States, up until 2007, under legislation enacted in 1986, Daylight Savings Time began at 2:00 am on the first Sunday of April and ended at 2:00 am on the last Sunday of October. In 2007 this has been changed, such that DST starts on the second Sunday of March until the first Sunday of November. Note that the dston field is potentially represented by more than one bit in the frame for the purpose of redundancy (i.e. robustness and error correction capabilities). Bit "leap" indicates whether a leap second is scheduled at the end of a predefined period (e.g., end of this month, half-year, etc.). A leap second may be added to the last minute of June 30$^{th}$, or December 31$^{st}$.

If DST is in effect (e.g., in July), then the interpretation of the 5-bit DST schedule word refers to when it is to end. If DST is not in effect (e.g., in December), the interpretation of this word refers to when it is to start again. The start date and end date options are listed in Table 6 above. A total of eight specific options are supported for each, and an "out of range" possibility is defined, in case the DST schedule is changed in the future to a time that is not within those covered by the table. Additional options are defined to allow for DST to be implemented permanently or to be cancelled altogether. With three possible values for the time at which the DST transition is to occur (1 AM, 2 AM or 3 AM) and a 4$^{th}$ option to be used for special messages, as shown in Table 5, a total of 32 combinations may exist for the DST 5-bit schedule word.

The Sundays in Column C of Table 6, indicating the start date of DST, are not in chronological order, since it is advantageous to designate the same word to the 1$^{st}$ Sunday of November and to the 2$^{nd}$ Sunday of March, being the most recently enacted end and start dates respectively. This allows for more efficient representation of the information under the assumption that this DST schedule, which is currently in use, will likely remain the schedule for many years to come. The other optional schedules are defined to allow some margin around what appears to be a possible schedules that could be instated in the future. It is to be noted that the last Sunday in October or in March may be either the 4$^{th}$ or the 5$^{th}$ Sunday of that month.

The 2-bit word comprising the DST status bit ("dston") and the leap-second notification bit ("leap") may be used immediately upon reception and is of high importance. These bits are relatively unpredictable and thus have high information content. Hence, in one embodiment, three parity bits are allocated to increase the robustness of the 2-bit word. The 2-bit word is encoded into 5 bits using a shortened Hamming systematic linear block code that provides relatively high robustness, as detailed infra.

In contrast, due to the highly disparate a priori probability for the DST transition schedule options, a nonlinear code is used to encode the 5-bit DST schedule word into a 6-bit codeword, providing non-uniform distancing for the various codewords, with the most probable one having the highest protection, i.e. the greatest Hamming distance from all other codewords.

The 2-bit word comprising the DST status bit ("dston") and the leap-second notification bit ("leap") and the 5-bit information word of scheduled DST time and date are encoded separately. This is because the 5-bit DST schedule word has specific content with high probability, which would represent less information, whereas the contents of the 2-bit word are more unpredictable. Due to the high uncertainty and importance of the 2-bit word, three parity bits are allocated to increase its robustness.

The Hamming block code used for encoding the 2-bit word in the additional information field is a systematic code, which means that the 2-bit information word input into the code also appears at its output and may be read there directly without decoding. The (5, 2) shortened Hamming systematic code that is used to encode these two information bits into a 5-bit code-word is derived from a (7, 4) Hamming systematic code.

The three additional parity bits are calculated according to the three "dlpar" equations below, which are derived from the generating matrix in Table 7 below. These parity bits are appended to the 2-bit word from the MSB side (i.e. are transmitted before the two bits). This code provides the receiver with the capability to correct one error and to detect up to two errors in the 5-bit word.

TABLE 7

DST Status/Leap Second 2-bit to 5-bit Encoding

| | | output (coded) word of 5 bits | | | | |
|---|---|---|---|---|---|---|
| | | bit 4 | bit 3 | bit 2 | bit 1 | bit 0 |
| input word | bit 1 | 1 | 1 | 0 | 1 | 0 |
| of 2 bits | bit 0 | 0 | 1 | 1 | 0 | 1 |

The equations below specify how each of the three parity bits, denoted "dlpar[i]" (i=0, 1, 2), is to be calculated using the two input bits denoted dston and leap. They are equivalent to multiplying a two element row vector, representing the 2-bit information word, by the 2×5 coding matrix, resulting in a five element row vector representing the codeword to be transmitted.

dlpar[0]=dston dlpar[1]=sum(modulo 2){leap, dston} dlpar[2]=leap

A lookup table showing the 5-bit to 6-bit encoding of the DST schedule is shown in Table 9 below. Due to the unequal a priori probability of each value for the 5-bit field for the DST schedule, the 5-bit to 6-bit encoder is nonlinear resulting in non-uniform distancing of the codewords, thus the encoder is based on a lookup table as specified in Table 9.

The mapping of the $2^5$=32 codewords to the information shown in Tables 5 and 6 is shown in the rightmost column. The codewords and their corresponding $d_{min}$ are shown. The first codeword, having a maximum $d_{min}$ of 3, is mapped to the most probable DST schedule, which is the one instated most recently (i.e. the DST period starting on the 2$^{nd}$ Sunday of March and ending on the 1$^{st}$ Sunday of November). Since the transition will most likely remain at 2 AM, and will be implemented on the same Sundays that it has been recently moved to, this combination was selected as the most probable one, for which the maximal coding protection was assigned in the non-linear code.

Thus, the most likely message, indicating the regular (i.e. current) schedule for the DST transition is designated codeword #0 (the first row in Table 9), for which the minimum. Hamming distance ($d_{min}$) is the highest ($d_{min}$=3). Other messages, having secondary likelihood, which have been used historically, are designated codewords having minimum Hamming distance $d_{min}$=2, while those of least probability or importance are designated the codewords having minimum Hamming distance $d_{min}$=1.

The minimum Hamming distance of each codeword reflects the error protection capability for that codeword. A codeword with greater hamming distance has higher error protection capability and is therefore assigned to an information word with higher a priori probability or greater importance. In the example embodiment shown in Table 9, codeword #0 (the first row), being the most probable word and having the strongest protection, has been assigned the value 111001 as these are the first six bits of the 7-bit barker code 1110010. The marker at the end of the 60-minute frame, being permanently assigned 0 in this embodiment, can serve as the last (7$^{th}$) bit. The addition of this 7-bit barker code can further enhance the synchronization capabilities, as it is likely that this word will be present most of the time.

TABLE 9

Lookup Table for DST Schedule Word 5-bit to 6-bit Encoder

| code-word | input word of 5 bits | | | | | output (coded) word of 6 bits | | | | | | | |
|---|---|---|---|---|---|---|---|---|---|---|---|---|---|
| index | bit 4 | bit 3 | bit 2 | bit 1 | bit 0 | bit 5 | bit 4 | bit 3 | bit 2 | bit 1 | bit 0 | dmin | message |
| 0 | 0 | 0 | 0 | 0 | 0 | 1 | 1 | 1 | 0 | 0 | 1 | 3 | 1st Sunday of Nov. or 2nd Sunday since “M” at 2 AM |
| 1 | 1 | 0 | 0 | 0 | 0 | 1 | 0 | 0 | 0 | 0 | 0 | 2 | “O” or 6th Sunday since “M” at 2 AM |
| 2 | 0 | 1 | 0 | 0 | 0 | 0 | 0 | 1 | 0 | 0 | 0 | 2 | 2nd Sunday of Nov. or 5th Sunday since “M” at 2 AM |
| 3 | 1 | 1 | 0 | 0 | 0 | 1 | 0 | 1 | 1 | 0 | 0 | 2 | 1st Sunday before “O” or “M” at 2 AM |
| 4 | 0 | 0 | 1 | 0 | 0 | 1 | 0 | 1 | 0 | 1 | 0 | 2 | 2nd Sunday before “O” or 3rd Sunday since “M” at 2 AM |
| 5 | 1 | 0 | 1 | 0 | 0 | 0 | 0 | 0 | 0 | 0 | 1 | 2 | 3rd Sunday of Nov. or 4th Sunday since “M” at 2 AM |
| 6 | 0 | 1 | 1 | 0 | 0 | 1 | 0 | 0 | 1 | 0 | 1 | 2 | 3rd Sunday before “O” or 8th Sunday since “M” at 2 AM |
| 7 | 1 | 1 | 1 | 0 | 0 | 0 | 0 | 1 | 1 | 0 | 1 | 2 | 4th Sunday of Nov. or 7th Sunday since “M” at 2 AM |
| 8 | 0 | 0 | 0 | 1 | 0 | 1 | 0 | 0 | 0 | 1 | 1 | 2 | DST out of range |
| 9 | 1 | 0 | 0 | 1 | 0 | 0 | 0 | 1 | 0 | 1 | 1 | 2 | DST permanently off |
| 10 | 0 | 1 | 0 | 1 | 0 | 1 | 0 | 1 | 1 | 1 | 1 | 2 | DST permanently on |
| 11 | 1 | 1 | 0 | 1 | 0 | 0 | 1 | 0 | 0 | 0 | 0 | 1 | 1st Sunday of Nov. or 2nd Sunday since “M” at 3 AM |
| 12 | 0 | 0 | 1 | 1 | 0 | 0 | 0 | 0 | 1 | 0 | 0 | 1 | “O” or 6th Sunday since “M” at 3 AM |
| 13 | 1 | 0 | 1 | 1 | 0 | 1 | 1 | 0 | 1 | 0 | 0 | 1 | 2nd Sunday of Nov. or 5th Sunday since “M” at 3 AM |
| 14 | 0 | 1 | 1 | 1 | 0 | 0 | 1 | 1 | 1 | 0 | 0 | 1 | 1st Sunday before “O” or “M” at 3 AM |
| 15 | 1 | 1 | 1 | 1 | 0 | 0 | 0 | 0 | 0 | 1 | 0 | 1 | 2nd Sunday before “O” or 3rd Sunday since “M” at 3 AM |
| 16 | 0 | 0 | 0 | 0 | 1 | 1 | 1 | 0 | 0 | 1 | 0 | 1 | 3rd Sunday of Nov. or 4th Sunday since “M” at 3 AM |
| 17 | 1 | 0 | 0 | 0 | 1 | 0 | 1 | 1 | 0 | 1 | 0 | 1 | 3rd Sunday before “O” or 8th Sunday since “M” at 3 AM |
| 18 | 0 | 1 | 0 | 0 | 1 | 1 | 0 | 0 | 1 | 1 | 0 | 1 | 4th Sunday of Nov. or 7th Sunday since “M” at 3 AM |
| 19 | 1 | 1 | 0 | 0 | 1 | 0 | 1 | 0 | 1 | 1 | 0 | 1 | 1st Sunday of Nov. or 2nd Sunday since “M” at 1 AM |
| 20 | 0 | 0 | 1 | 0 | 1 | 0 | 0 | 1 | 1 | 1 | 0 | 1 | “O” or 6th Sunday since “M” at 1 AM |
| 21 | 1 | 0 | 1 | 0 | 1 | 1 | 1 | 1 | 1 | 1 | 0 | 1 | 2nd Sunday of Nov. or 5th Sunday since “M” at 1 AM |
| 22 | 0 | 1 | 1 | 0 | 1 | 0 | 1 | 0 | 1 | 0 | 1 | 1 | 1st Sunday before “O” or “M” at 1 AM |
| 23 | 1 | 1 | 1 | 0 | 1 | 0 | 1 | 0 | 0 | 1 | 1 | 1 | 2nd Sunday before “O” or 3rd Sunday since “M” at 1 AM |
| 24 | 0 | 0 | 0 | 1 | 1 | 0 | 0 | 0 | 1 | 1 | 1 | 1 | 3rd Sunday of Nov. or 4th Sunday since “M” at 1 AM |
| 25 | 1 | 0 | 0 | 1 | 1 | 1 | 1 | 0 | 1 | 1 | 1 | 1 | 3rd Sunday before “O” or 8th Sunday since “M” at 1 AM |
| 26 | 0 | 1 | 0 | 1 | 1 | 0 | 1 | 1 | 1 | 1 | 1 | 1 | 4th Sunday of Nov. or 7th Sunday since “M” at 1 AM |
| 27 | 1 | 1 | 0 | 1 | 1 | 0 | 1 | 0 | 1 | 0 | 0 | 1 | reserved 1 |
| 28 | 0 | 0 | 1 | 1 | 1 | 0 | 1 | 0 | 0 | 1 | 0 | 1 | reserved 2 |
| 29 | 1 | 0 | 1 | 1 | 1 | 1 | 1 | 0 | 1 | 1 | 0 | 1 | reserved 3 |
| 30 | 0 | 1 | 1 | 1 | 1 | 0 | 1 | 1 | 1 | 1 | 0 | 1 | reserved 4 |
| 31 | 1 | 1 | 1 | 1 | 1 | 0 | 1 | 0 | 1 | 1 | 1 | 1 | reserved 5 |

In Table 9, “0” represents the last Sunday of October and “M” represents the first Sunday of March. Since the DST schedule word is followed by the synchronization sequence, it is desirable to configure the most probable DST schedule word, in conjunction with the synchronization sequence, to have good autocorrelation properties. Therefore, in one embodiment, an offset word C is added to all codewords in Table 9 in order to improve the synchronization performance while maintaining the minimum Hamming distance of the codewords.

As described supra, the additional information includes a 2-bit word for DST status and leap second and a 5-bit word representing the schedule for the next DST transition. The 2-bit word is encoded into 5-bits using a shortened Hamming systematic code.

The (5, 2) shortened Hamming systematic code used is derived from a (7, 4) Hamming systematic code by deleting two columns in the submatrix Q of the parity check matrix H. The encoder and decoder structure is the same as the ones used for the time word. The parity check matrix H and the generator matrix G are shown in Tables 10 and 11, respectively, below.

TABLE 10

Parity Check Matrix H for (5, 2) Shortened Systematic Hamming Code

| | | input (coded) word of 5 bits | | | | |
|---|---|---|---|---|---|---|
| | | bit 4 | bit 3 | bit 2 | bit 1 | bit 0 |
| output syndrome of 3 bits | bit 2 | 1 | 0 | 0 | 1 | 0 |
| | bit 1 | 0 | 1 | 0 | 1 | 1 |
| | bit 0 | 0 | 0 | 1 | 0 | 1 |

TABLE 11

Generator Matrix G for the (5, 2) Shortened Systematic Hamming Code

| | | output (coded) word of 5 bits | | | | |
|---|---|---|---|---|---|---|
| | | bit 4 | bit 3 | bit 2 | bit 1 | bit 0 |
| input word of 2 bits | bit 1 | 1 | 1 | 0 | 1 | 0 |
| | bit 0 | 0 | 1 | 1 | 0 | 1 |

Figure 12:
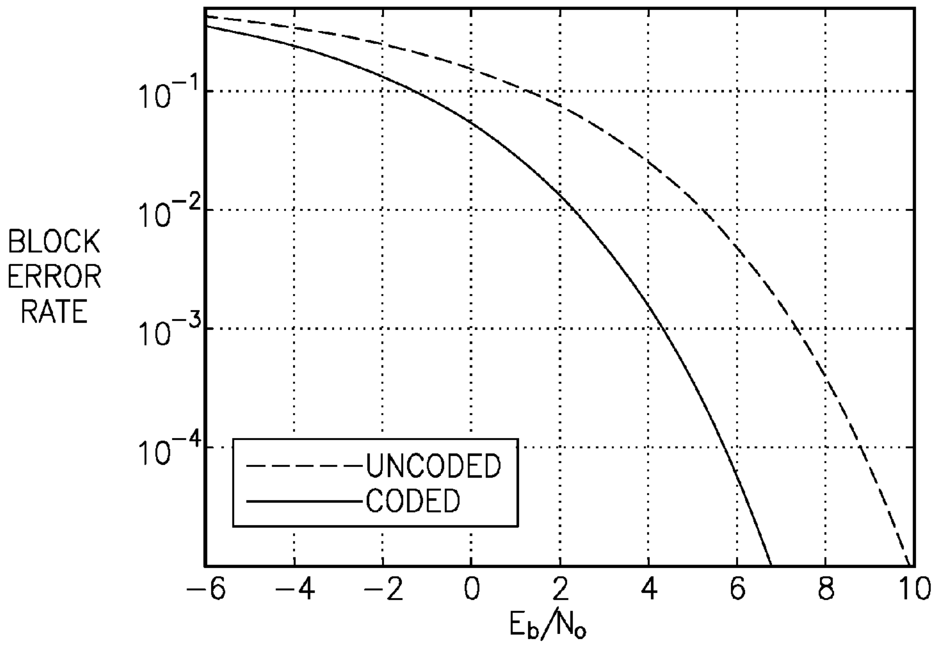
FIG. 12 is a graph illustrating the word error rate comparison for coded and uncoded versions of the DST and leap second indicators.

The assumption and evaluation of the WER performance is the same as with the (31, 26) Hamming code for the time word. A graph illustrating the performance with and without coding is shown in FIG. 12. At a WER of $10^{-3}$, corresponding to one error in 100 years if time acquisition is made 10 times in a year, the demodulation SNR is approximately 7.3 dB for the uncoded word and 4.3 dB for the coded word, thereby representing a coding gain of 3 dB. Note that the WER performance for this 2-bit field is better than that of the 26-bit field time word with or without coding, simply because the field is shorter.

The nonlinear code used for the 5-bit DST schedule field is designed such that at least one particular codeword will have maximum protection, corresponding to a maximal minimum Hamming distance, denoted as $d_{min}$. The remaining codewords are selected to have a maximal number of codewords of maximum $d_{min}$.

With the number of information bits denoted as k and the coded block size as n, the design of the codeword follows these steps: First, one n-length word, denoted as $c_M$, is chosen that has maximum protection against error. Once the code is constructed, an offset may be added to all codewords to obtain good autocorrelation properties for $c_M$. Second, all the n-length words are eliminated that have Hamming distance of i with the codeword $c_M$, where i=1, 2, . . . , m, and m is the largest integer that could satisfy the following conditions $$2^n - 2^k - \sum_{i=1}^{m} \binom{n}{m} \geq 0 \tag{10}$$

The equality in Equation 10 above ensures that the number of words that are eliminated is less than or equal to the total number of invalid codewords. For this (6, 5) non-linear code, we obtain m=2 implying $d_{min}=3$. The remaining set of words, denoted as R, would have r=42 elements.

Third, the set R is divided into two sets: set $S_1$ and set $S_2$, which together contain n-length words with $d_{min}=1$ and 2 within the set respectively. Note that each word in R must be in set $S_1$ or in set $S_2$ but cannot be in both sets, i.e. $R=S_1 \cup S_2$ and $S_1 \cap S_2 = \emptyset$. This problem is formulated as a linear program to ensure the maximum number of words in set $S_2$. The cardinality of set $S_1$ and set $S_2$ are represented by $s_1$ and $s_2$. The framework of the linear program is further described infra.

If the number of words in set $S_2$ is no less than the codeword needed, i.e. $s_2 \geqq 2^k-1$, the design is performed by arbitrarily picking $2^k-1$ words in set $S_2$. Otherwise, which is the case in the (6, 5) nonlinear code of the example embodiment of Table 9, a second linear program is needed to choose $2^k-1-s_2$ words from set $S_1$, such that a minimal number of words in set $S_2$ has a reduced $d_{min}$. The framework of the linear program is further described infra.

The first linear program comprises selecting a minimum number of words from set R to set $S_1$, such that set $S_2$ will have maximum cardinality. Let us denote the set of remaining n-length words as R, with cardinality r. Parameter A is a r×r indicator matrix, where $A_{i,j}=1$ if-and-only-if (iff) the Hamming distance between word i∈R and word j∈R is one. Binary variable $x_i=1$ iff word i∈R is chosen as a member of set $S_1$. For the convenience of notation, we also define binary variable y complement to x, i.e. $y_i=\bar{x}_i$, where i=1, 2, . . . , r. The r×r matrix B is a binary variable, which represents the resulting indicator matrix after eliminating words of $d_{min}=1$ and putting them in set $S_1$.

The objective function is to minimize the number of words eliminated and put them in set $S_1$, i.e. $\min_{x,y,B} \sum_{i=1}^{r} x_i$, subject to constraints 11, 12 and 13.

The first constraint is the complementary relationship between variables x and y.

$$x_i = 1 - y_i,\ \forall i=1,2, \ldots, r \tag{11}$$

The second constraint is the relationship between indicator matrix A and B. In other words, by eliminating codewords with $d_{min}=1$, variable y will zero out the ones in matrix A resulting in matrix B.

$$B_{i,j} \geqq A_{i,j} y_i y_j,\ \forall i=1,2, \ldots, r \text{ and } \forall j=1,2, \ldots r \tag{12}$$

The third constraint is that set T should not have codewords with $d_{min}=1$.

$$\sum_{i=1}^{r} \sum_{j=1}^{r} B_{i,j} = 0 \tag{13}$$

Considering the (6, 5) nonlinear code of this example embodiment, the cardinalities of set $S_1$ and $S_2$ are 16 and 26, respectively. Since the cardinality of set $S_2$ is less than the requirement number of codewords 31, a second linear programming procedure is used.

The second linear programming procedure is to choose $2^k-1-S_2$ words from set to set $S_2$ such that the resulting set has a maximum number of codewords with $d_{min}=2$. Set $S_1$ and set $S_2$ represent the sets of n-length words that have a $d_{min}$ of one and two within the set respectively, with cardinalities $s_1$ and $s_2$ respectively. Binary parameter D is defined as a $s_1 \times s_2$ matrix, such that $D_{i,j}=1$ iff word i∈$S_2$ and word j∈$S_1$ have Hamming distance of one. Parameter $n_{needone}$ denotes the number of codewords needed to be taken from set $S_1$, in this case $n_{needone}=2^k-1s_2=5$. Binary variable $g_i=1$ iff word i∈$S_1$ is selected. Decision variable $h_i$ denotes the number of words picked from set $S_1$ to set $S_2$ that have Hamming distance of one with word i∈$S_2$. Binary variable z is the indicator of variable h, i.e. $z_i=1$ iff $h_i>0$.

The goal is to minimize the words in set $S_2$ that will have a decreased $d_{min}$ due to the codewords selected from set $S_1$, which can be written as $\min_{g,h,z} \sum_{i=1}^{s_2} z_i$ subject to constraints 14, 15 and 16.

The first constraint is the relationship between variable h and z, which is given as $$z_i \geq \frac{h_i}{s_1} \forall\ i \in S_2 \tag{14}$$

Where the division serves to ensure the binary variable $z_i$ is always greater than the right-hand-size, by letting the right-hand-side be less than or equal to one.

The second constraint is the relationship between variable g and h. For a given word in set $S_2$, the number of codewords selected from set $S_1$ that have a Hamming distance of one associated with them is given by summing the rows of the chosen codeword in indicator matrix D.

$$h_j = \sum_{i=1}^{S_1} g_i D_{i,j} \quad \forall\ j \in S_2 \tag{15}$$

The third constraint ensures that the number of words picked from set $S_1$ is no less than needed.

$$\sum_{i=1}^{S_1} g_i \geq n_{needone} \tag{16}$$

Considering the (6, 5) nonlinear code, five codewords are selected from set $S_1$ to set $S_2$, and there are 16 words from set $S_2$ that have a reduced $d_{min}=1$. In summary, there is one codeword that has $d_{min}=3$; 10 codewords that have $d_{min}=2$; and the remaining 20 codewords have $d_{min}=1$.

Regarding receiver performance, for a given signal-to-noise-ratio (SNR), the calculation of probability of bit error for BPSK and the uncoded block error rate are given by Equations 6 and 8 infra, respectively. To simplify the performance analysis, the same assumption is made that the receiver only makes one acquisition attempt and tries to correct any errors. Given a received word, the decoder compares the Hamming distance between the received word and all codewords and chooses the codeword that has minimum Hamming distance with the received word as its estimated output. If there are two or more codewords that yield the same Hamming distance, the receiver chooses the codeword listed earliest in the codebook.

Figure 13:
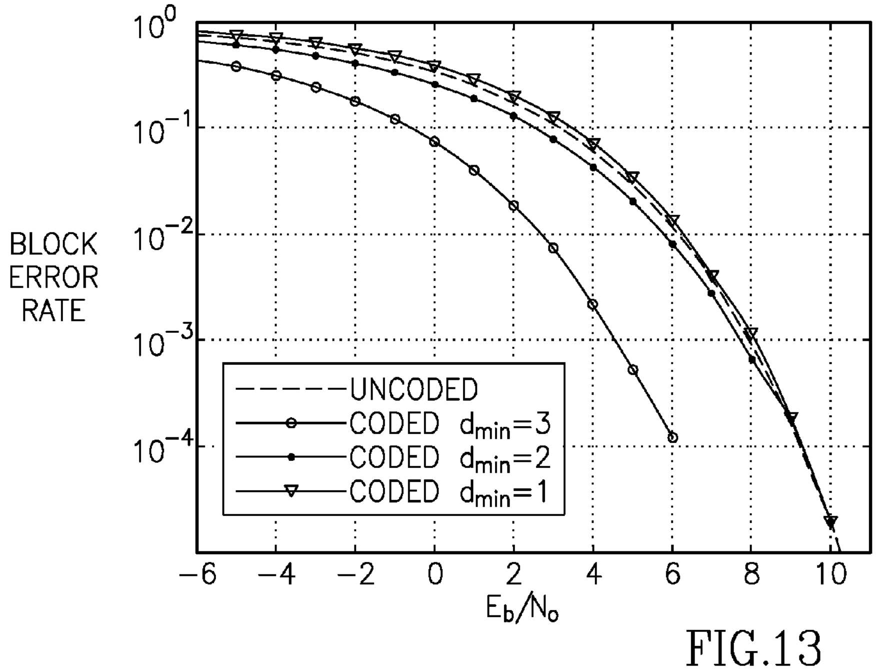
FIG. 13 is a graph illustrating the word error rate comparison for coded and uncoded versions of the DST schedule word.

The codewords in the codebook can be listed according to the a priori probability of each codeword. A graph illustrating the average word error rate (WER) of codewords that have different $d_{min}$s is shown in FIG. 13. The performance at the WER of $10^{-3}$ is also compared, which corresponds to one error in 100 years if 10 acquisitions are made every year. The demodulation SNR is approximately 4.5 dB for the most protectively coded word and 8 dB for the rest, including uncoded words and coded word with $d_{min}$ of 1 and 2. Hence, FIG. 13 shows a 3.5 dB coding gain on the most protective codeword and almost zero coding gain for other codewords.

The performance of using the most protective codeword is superior due to the following reasons: (1) it has the maximum $d_{min}$; and (2) it is listed first in the codebook since it has the largest a priori probability. In other words, whenever a word is received having the same Hamming distance to the most protected/probable codeword as to some other codeword, the receiver always chooses the most protected/probable word. This is why codewords with $d_{min}$=2 only have marginal coding gain. The performance of the codewords that have $d_{min}$=2, however, could potentially be much higher than codewords that have $d_{min}$=1 since the decoder can still detect when a single error occurs, although it might correct it to the wrong codeword. The detection capability of the codeword with $d_{min}$=2 can reduce the occurrence of wrong correction by considering the SNR estimate information.

To increase the reliability of the extracted information, a device operating in accordance with the present invention may repeat the reception of the DST schedule word, at the cost of energy consumption, whenever an error in it is detected, rather than attempting to correct it,

Frame Generator

Figure 14:
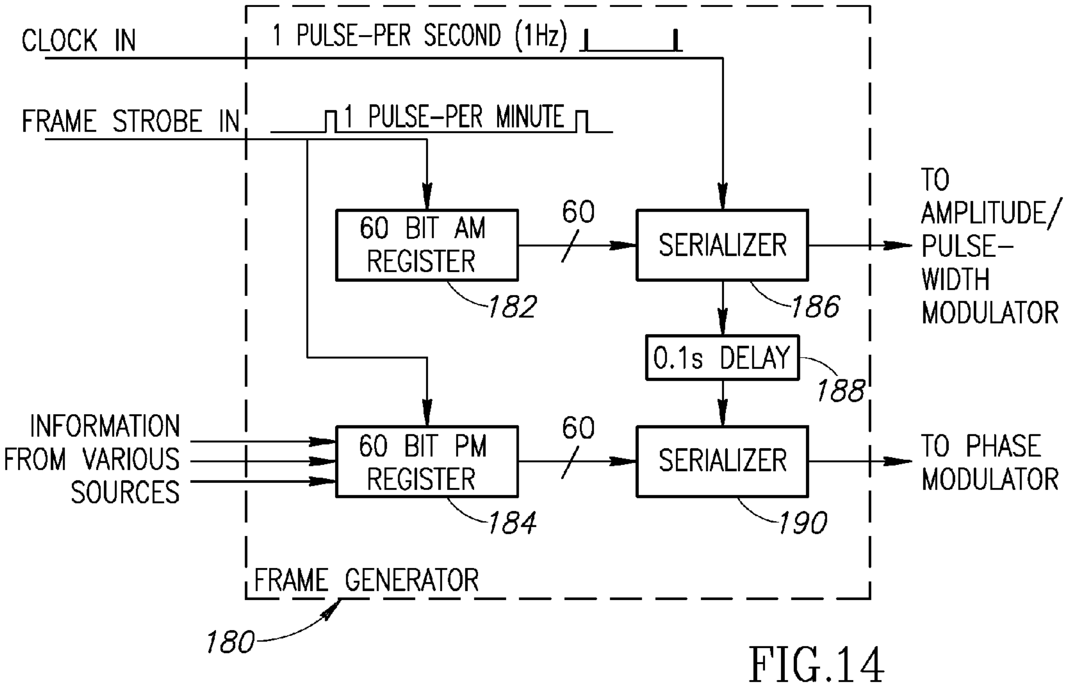
FIG. 14 is a block diagram illustrating an example parallel to serial conversion of AM and PM bits.

A block diagram illustrating an example parallel to serial conversion of AM and PM bits is shown in FIG. 14. The frame generator, generally referenced 180, comprises a 60-bit AM register 182, 60-bit PM register 184, serializers 186, 190 and delay 188. The frame generator and modulator in the time code generator 14 (FIG. 1) are operative to output the 60-bit frame for both the amplitude and phase-modulated data. The bit allocation for the AM and PM data are shown in FIGS. 9 and 10 as described supra.

The input signals to the phase modulation frame generator include the following: The CLOCK IN signal comprises a 1 pulse per second (pps) signal derived from an accurate frequency reference that is input to the TCG, e.g., 5 MHz). The FRAME STROBE input is a pulse provided every minute to trigger the generation of a new 60-bit frame. A PM ENABLE IN input is used to enable/disable the phase modulation. It is gated with the FRAME STROBE IN signal in order to ensure that is takes effect only on frame boundaries.

The time information, which includes the minute, hour and date, is initially input by the user or through a user interface such as a touch screen. In one embodiment (FIG. 10, for example), this information is converted into a 26-bit minute counter representing the number of minutes that have elapsed since the beginning of the century. The time keeping operation requires incrementing this counter and detecting once the century is over, at which time it will transition to zero. As described supra, the 26-bit time word is encoded into a 31-bit code word which is conveyed in the frame locations {time[0] . . . time[25], timepar[0] . . . timepar[4]} as shown in FIG. 10.

Aside from in the time information, an additional information field comprising 11-bits is provided, as described supra. This field includes information such as the schedule for DST transition and leap second. This field is based on two information words of 2-bits and 5-bits that are encoded into 5-bit and 6-bits, respectively, for error detection and correction. The contents of this field are conveyed in frame locations {dston, leap, dlpar[0], dlpar[1], dlpar[2]} and {dst[0] . . . dst[5]} as shown in FIGS. 9 and 10.

The output generated by the PM frame generator is a 60-bit word that is serialized in the time code generator in parallel with the serialization of the 60-bit AM word where each is input to the appropriate modulator (i.e. amplitude or phase) as shown in FIG. 14.

The frame also comprises a 14-bit synchronization word that is placed in locations {sync[0] . . . sync[13]} of the 60-bit time frames. A different synchronization word {sync_M[0] . . . sync_M[13]} is used for message frames.

In one embodiment, regarding the relative timing for the phase modulation, the 60-bit word that determines the phase modulation for the carrier is synchronized to the 60-second frame-timing dictated by the existing AM/pulse-width modulation and is delayed 100 ms (delay 188, FIG. 14) with respect to it, such that the boundaries for each PM bit of 1-second duration do not coincide with those of the AM bits. This delay is introduced in order to avoid 180° phase transitions when the amplitude is transitioning, which effectively creates a greater transient for the transmitter.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A radio receiver method, said method comprising:

receiving, in a radio receiver circuit, a phase modulated (PM), pulse width modulated (PWM)/amplitude shift keyed (ASK) broadcast signal encoded with time information frames;

extracting, in said radio receiver circuit, said time information frames from the phase of said received signal;

wherein each said time information frame includes a timing information field for timing tracking based on a synchronization sequence field spanning multiple seconds, a current time field for time acquisition and an additional information field for event scheduling;

wherein said phase modulation comprises pulse width modulation/amplitude shift keyed modulated data transmitted with and without a phase reversal; and wherein information represented by said phase modulation is independent of the information represented by said pulse width modulation/amplitude shift keyed modulation.

2. The method according to claim 1, wherein said additional information field further comprises a daylight-saving time data field.

3. The method according to claim 1, wherein said additional information field further comprises a leap second data field.

4. The method according to claim 1, wherein said additional information field further comprises a daylight saving time data field and leap second data field, which are jointly protected using an error correcting code.

5. The method according to claim 1, wherein said current time field indicates the current minute, hour, date and year expressed as a number of hours from the beginning of the current century.

6. The method according to claim 1, wherein said current time field indicates the current minute, hour, date and year expressed as a number of minutes from the beginning of the current century.

7. The method according to claim 1, wherein said current time field comprises a current time protected using an error correcting code.

8. The method according to claim 1, further comprising avoiding using marker symbols in a WWVB legacy protocol to convey time information.

9. The method according to claim 1, further comprising using marker symbols in a WWVB legacy protocol only to convey timing information using said synchronization sequence.

10. The method according to claim 1, wherein said synchronization sequence field comprises a 14-bit synchronization sequence.

11. A radio receiver method, said method comprising:

receiving, in a radio receiver circuit, a phase modulated (PM), pulse width modulated (PWM)/amplitude shift keyed (ASK) broadcast signal encoded with time information frames;

extracting, in said radio receiver circuit, said time information frames from the phase of said received signal;

wherein each said time information frame includes a timing information field for timing tracking based on a synchronization sequence field spanning multiple seconds, a current time field for time acquisition and an additional information field for event scheduling including a daylight saving time data field and leap second data field;

wherein said current time field and said additional information field are protected using an error correcting code;

wherein said phase modulation comprises pulse width modulation/amplitude shift keyed modulated data transmitted with and without a phase reversal; and wherein information represented by said phase modulation is independent of the information represented by said pulse width modulation/amplitude shift keyed modulation.

12. The method according to claim 11, wherein said current time field indicates the current minute, hour, date and year expressed as a number of hours from the beginning of the current century in a first subfield and the current minute (0-59) in a second sub-field.

13. The method according to claim 11, wherein said current time field indicates the current minute, hour, date and year expressed as a number of minutes from the beginning of the current century.

14. A radio receiver, comprising:

a receiver circuit operative to receive a phase modulation (PM) over pulse width modulation (PWM)/amplitude shift keyed (ASK) broadcast signal encoded with time information frames;

a circuit operative to extract said time information frames from the phase of said received signal;

wherein each said time information frame includes a timing information field for timing tracking based on a synchronization sequence field spanning multiple seconds, a current time field for time acquisition and an additional information field for event scheduling including a daylight saving time data field and leap second data field;

wherein said current time field and said additional information field are protected using an error correcting code;

wherein said phase modulation comprises pulse width modulation/amplitude shift keyed modulated data transmitted with and without a phase reversal; and wherein information represented by said phase modulation is independent of the information represented by said pulse width modulation/amplitude shift keyed modulation.

15. The receiver according to claim 14, wherein said current time field is split into a first sub-field indicating the current minute (0-59) and a second sub-field indicating the hour, date and year expressed as a number of hours from the beginning of the current century.

16. The receiver according to claim 14, wherein said current time field indicates the current minute, hour, date and year expressed as a number of minutes from the beginning of the current century.

17. A radio receiver, comprising:

a receiver circuit operative to receive a phase modulated (PM), pulse width modulation (PWM)/amplitude shift keyed (ASK) broadcast signal encoded with time information frames;

a circuit operative to extract said time information frames from the phase of said received signal;

wherein each said time information frame includes a timing information field for timing tracking based on a synchronization sequence field spanning multiple seconds, a current time field for time acquisition and an additional information field for event scheduling;

wherein said phase modulation comprises pulse width modulation/amplitude shift keyed modulated data transmitted with and without a phase reversal; and wherein information represented by said phase modulation is independent of the information represented by said pulse width modulation/amplitude shift keyed modulation.

18. The receiver according to claim 17, wherein said current time field indicates the current minute, hour, date and year expressed as a number of hours from the beginning of the current century in a first subfield and the current minute (0-59) in a second sub-field.

19. The receiver according to claim 17, wherein said current time field indicates the current minute, hour, date and year expressed as a number of minutes from the beginning of the current century.

20. The receiver according to claim 17, wherein said additional information field further comprises a daylight saving time data field.

21. The receiver according to claim 17, wherein said additional information field further comprises a leap second data field.

22. The receiver according to claim 17, wherein said additional information field further comprises a daylight saving time data field and leap second data field, both of which are protected using an error correcting code.

23. The receiver according to claim 17, wherein said additional information field further comprises a field to indicate whether daylight saving time is in effect or not, said indication provided with an error correcting code.

24. The receiver according to claim 17, wherein said current time field comprises a current time protected using an error correcting code.

25. The receiver according to claim 17, wherein marker symbols in a WWVB legacy protocol are not used to convey time information.

26. The receiver according to claim 17, wherein marker symbols in a WWVB legacy protocol are used only to convey timing information using said synchronization sequence.

27. The receiver according to claim 17, wherein said synchronization sequence field comprises a 14-bit synchronization sequence.

28. The receiver according to claim 17, wherein the least-significant bit (LSB) of said current time field is extracted during a tracking operation.

* * * * *